(12) United States Patent
Hongkham et al.

(10) Patent No.: US 8,019,467 B2
(45) Date of Patent: Sep. 13, 2011

(54) SCHEDULING METHOD FOR PROCESSING EQUIPMENT

(75) Inventors: Steve S. Hongkham, San Ramon, CA (US); Eric A. Englhardt, Palo Alto, CA (US); Michael R. Rice, Pleasanton, CA (US); Helen R. Armer, Cupertino, CA (US); Chongyang Chris Wang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1067 days.

(21) Appl. No.: 11/775,355

(22) Filed: Jul. 10, 2007

(65) Prior Publication Data

US 2008/0014058 A1    Jan. 17, 2008

Related U.S. Application Data

(60) Provisional application No. 60/806,906, filed on Jul. 10, 2006.

(51) Int. Cl.
*G06F 7/00* (2006.01)

(52) U.S. Cl. ........................................ 700/228; 700/214

(58) Field of Classification Search .................. 700/228, 700/214, 213, 95, 96, 99, 245; 703/7; 414/222.01, 414/806; 901/50
See application file for complete search history.

(56) References Cited

U.S. PATENT DOCUMENTS

| | | |
|---|---|---|
| 4,836,733 A | 6/1989 | Hertel et al. |
| 4,892,761 A | 1/1990 | Yamada |
| 4,966,094 A | 10/1990 | Yamada |
| 5,764,520 A | 6/1998 | Robinson et al. |
| 5,867,389 A | 2/1999 | Hamada et al. |
| 5,898,588 A | 4/1999 | Morimoto |
| 5,932,380 A | 8/1999 | Yaegashi et al. |
| 5,943,230 A | 8/1999 | Rinnen et al. |
| 6,074,443 A | 6/2000 | Venkatesh et al. |
| 6,076,652 A | 6/2000 | Head, III |
| 6,122,566 A | 9/2000 | Nguyen et al. |
| 6,336,204 B1 | 1/2002 | Jevtic |
| 6,418,356 B1 | 7/2002 | Oh |
| 6,507,770 B2 | 1/2003 | Tateyama et al. |
| 6,526,329 B2 | 2/2003 | Tateyama et al. |
| 6,571,147 B1 | 5/2003 | Kashihara |
| 6,645,780 B1 | 11/2003 | Sonderman et al. |
| 6,665,575 B2 | 12/2003 | Betawar et al. |
| 6,678,572 B1 | 1/2004 | Oh |

(Continued)

OTHER PUBLICATIONS

PCT International Search Report and Written Opinion dated Mar. 12, 2008 for International Application No. PCT/US2007/73055.

*Primary Examiner* — Ramya Prakasam
(74) *Attorney, Agent, or Firm* — Patterson & Sheridan, L.L.P.

(57) ABSTRACT

Methods and apparatus for processing substrates using a multi-chamber processing system (e.g., a cluster tool) that has an increased system throughput and repeatable wafer processing history are provided. In one embodiment a first substrate is transferred from a first position to a second position and then the first substrate is transferred from the second position to a third position using a first robot. A second substrate is transferred from a first position to a second position and then the second substrate is transferred from the second position to a third position using a second robot. The movement of the first and second robots is synchronized so that the movement from the first position to the second position by the first and second robot is performed within a first time interval.

18 Claims, 24 Drawing Sheets

U.S. PATENT DOCUMENTS

| | | |
|---|---|---|
| 6,694,218 B2 | 2/2004 | Oh |
| 6,729,824 B2 | 5/2004 | Lei et al. |
| 6,756,243 B2 | 6/2004 | Pasadyn et al. |
| 6,768,930 B2 * | 7/2004 | Oh .................. 700/217 |
| 6,807,452 B2 | 10/2004 | Mukuta et al. |
| 6,807,455 B2 | 10/2004 | Yoshida et al. |
| 6,834,210 B2 | 12/2004 | Tateyama et al. |
| 6,851,872 B1 | 2/2005 | Okubo et al. |
| 6,852,644 B2 * | 2/2005 | Dickinson .................. 438/758 |
| 6,889,105 B2 | 5/2005 | Mukuta et al. |
| 6,897,131 B2 | 5/2005 | Ramachandran et al. |
| 6,950,716 B2 | 9/2005 | Ward et al. |
| 6,952,622 B2 | 10/2005 | Babikian et al. |
| 6,968,252 B1 | 11/2005 | Pasadyn et al. |
| 6,999,836 B2 | 2/2006 | Schwarm et al. |
| 7,039,501 B2 | 5/2006 | Freeman et al. |
| 7,051,250 B1 | 5/2006 | Allen, Jr. et al. |
| 7,052,919 B2 * | 5/2006 | Oh .................... 438/5 |
| 7,152,011 B2 | 12/2006 | Benjamin et al. |
| 7,460,972 B2 | 12/2008 | Somayaji et al. |
| 7,522,968 B2 | 4/2009 | Hongkham et al. |
| 2002/0059015 A1 * | 5/2002 | Oh ............... 700/213 |
| 2003/0028282 A1 * | 2/2003 | Oh ............... 700/213 |
| 2003/0154001 A1 * | 8/2003 | Oh ............... 700/217 |
| 2004/0078109 A1 * | 4/2004 | Babikian et al. ............. 700/121 |
| 2005/0186765 A1 | 8/2005 | Ma et al. |
| 2006/0155412 A1 | 7/2006 | Ikeda |
| 2006/0156979 A1 | 7/2006 | Thakur et al. |
| 2007/0003842 A1 | 1/2007 | Wang et al. |
| 2007/0282474 A1 | 12/2007 | Schmidt |
| 2008/0051929 A1 | 2/2008 | Hongkham et al. |
| 2008/0051930 A1 * | 2/2008 | Oh et al. ................ 700/214 |
| 2008/0223293 A1 | 9/2008 | Ishikawa et al. |
| 2009/0064928 A1 | 3/2009 | Ishikawa et al. |

* cited by examiner

| | | | | | |
|---|---|---|---|---|---|
| CD2 | 160 CD6 | 190 B6 | 180 C18 | 130 PEB6 |
| | | 190 B5 | 180 C17 | 130 PEB5 |
| | 160 CD5 | 190 B4 | 180 C16 | 130 PEB4 |
| CD1 | | 190 B3 | 180 C15 | 130 PEB3 |
| | 160 CD4 | 190 B2 | 180 C14 | 130 PEB2 |
| | | 190 B1 | 180 C13 | 130 PEB1 |
| 180 C6 DP6 | 160 CD8 | 190 B8 | 180 C12 |
| 180 C5 DP5 | | 190 B7 | 180 C11 |
| 180 C4 DP4 | 160 CD7 | 180 C10 | 162 OEBR 2 |
| 180 C3 DP3 | | 180 C9 | |
| 180 C2 DP2 | | 180 C8 | 162 OEBR 1 |
| 180 C1 DP1 | | 180 C7 | |

| ROBOT # | | | | 11A | | | 11B | | | 11C | |
|---|---|---|---|---|---|---|---|---|---|---|---|
| MOVE # | TIME | MOVE TYPE | MOVE SIZE | STEP | ZONE | MOVE SIZE | STEP | ZONE | MOVE SIZE | STEP | ZONE |
| 1 | 1.8 | M | L | MOVE PR | 2 | | MOVE PTp | 3x | | MOVE PTo | 1x |
| | 2.1 | D/P | | DROP PR | 2 | | DROP PTp | 3x | | DROP PTo | 1x |
| | 1.8 | M | L | MOVE PTi | 1 | | MOVE PR | 2 | | MOVE PEB/C | 3x |
| | 2.1 | P/D | | PICK PTi | 1 | | PICK PR | 2 | | Gs: PEB/C | 3x |
| | 1.8 | M | L | MOVE BARC | 1 | | MOVE PR B/C | 3 | | MOVE DEV | 1x/2x |
| | 2.1 | P/D | | PICK BARC | 1 | | PICK PR B/C | 3 | | PICK DEV | 1x/2x |
| 2 | 2.1 | D/P | L | DROP BARC | 1 | | DROP PR B/C | 3 | | DROP DEV | 1x/2x |
| | 1.0 | M | | MOVE BARC B/C | 3 | | | | | | |
| | 2.1 | P/D | | PICK BARC B/C | 3 | | | | | | |
| 3 | 0 | M | | | | | | | | | |
| | 2.1 | D/P | | DROP BARC B/C | 3 | | | | | | |

| ROBOT # | | | 11A | | | 11B | | | 11C | | |
|---|---|---|---|---|---|---|---|---|---|---|---|
| MOVE # | TIME | MOVE TYPE | MOVE SIZE | STEP | ZONE | MOVE SIZE | STEP | ZONE | MOVE SIZE | STEP | ZONE |
| 1 | 1.8 | M | L | MOVE PR | 2 | | | | | MOVE PTo | 1x |
| | 2.1 | D/P | | DROP PR | 2 | | | | | DROP PTo | 1x |
| | 1.8 | M | L | MOVE PTi | 1 | | | | | MOVE PEB/C | 3x |
| | 2.1 | P/D | | PICK PTi | 1 | | | | | Gs: PEB/C | 3x |
| | 1.8 | M | L | MOVE BARC | 1 | | MOVE PR B/C | 3x | | MOVE DEV | 1x/2x |
| | 2.1 | P/D | | PICK BARC | 1 | | PICK PR B/C | 3x | | PICK DEV | 1x/2x |
| 2 | 2.1 | D/P | | DROP BARC | 1 | | DROP PR B/C | 3 | | DROP DEV | 1x/2x |
| | 1.8 | M | L | MOVE BARC B/C | 3 | | MOVE PTp | 3x | | | |
| | 2.1 | P/D | | PICK BARC B/C | 3 | | DROP PTp | 3x | | | |
| 3 | 1.8 | M | | | | | MOVE PR | 2 | | | |
| | 2.1 | D/P | | DROP BARC B/C | 3 | | PICK PR | 2 | | | |

FIG. 3B

| ROBOT # | 1 | | | | |
|---|---|---|---|---|---|
| | TIME | MOVE TYPE | MOVE SIZE | STEP | ZONE |
| START MOVE (INPUT = PICK) | | M | L | MOVE PTi | 1 |
| | | P | L | PICK PTi | 1 |
| MIDDLE MOVE | | M | L | MOVE BARC | 1 |
| | | P/D | O | PICK BARC | 1 |
| | | M | L | DROP BARC MOVE BARC B/C | 1 3 |
| | | P/D | | DROP BARC B/C | 3 |
| MIDDLE MOVE | | M | S | MOVE BARC B/C | 3 |
| | | D/P | L | PICK BARC B/C | 3 |
| | | M | | MOVE P/H | 2 |
| END MOVE (OUTPUT = DROP) | | P/D | | DROP P/H | 2 |

| ROBOT # | TIME | | | | |
|---|---|---|---|---|---|
| | 2 | | MOVE TYPE | MOVE SIZE | STEP | ZONE |
| START MOVE (INPUT = PICK) | | M | L | MOVE PR | 2 |
| | | P | | PICK PR | 2 |
| MIDDLE MOVE | | M | L | MOVE PR B/C | 3 |
| | | P/D | | DROP PR B/C | 3 |
| | | M | S | MOVE PR B/C | 3 |
| | | D/P | | PICK PR B/C | 3 |
| END MOVE (OUTPUT = DROP) | | M | L | MOVE PTp | 3x |
| | | D | | DROP PTp | |

| ROBOT # | TIME | MOVE TYPE | MOVE SIZE | STEP | ZONE |
|---|---|---|---|---|---|
| 3 | | | | | |
| START MOVE (INPUT = PICK) | | M | L | MOVE PEB/C | 3x |
| | | P | L | PICK PEB/C | 3x |
| MIDDLE MOVE | | M | L | MOVE DEV | 1x/2x |
| | | P/D | O | PICK DEV | 1x/2x |
| | | M | L | DROP DEV | 1x/2x |
| END MOVE (OUTPUT = DROP) | | D/P | | MOVE PTo | 1x |
| | | M | | DROP PTo | 1x |
| | | D | | | |

| ROBOT # | | | | 1 | | | | 2 | | | | 3 | | | |
|---|---|---|---|---|---|---|---|---|---|---|---|---|---|---|---|---|
| MOVE # | | | | | | | | | | | | | | | | |
| | TIME | MOVE TYPE | MOVE SIZE | STEP | ZONE | MOVE SIZE | STEP | ZONE | MOVE SIZE | STEP | ZONE | | | | |
| | | | | 1 | | | 2 | | | 3 | | | | | |
| | 1.8 | M | L | MOVE PR | 2 | L | MOVE PR B/C | 3 | L | MOVE PEB/C | 3x | | | | |
| | 2.1 | D | L | DROP PR | 2 | | DROP PR B/C | 3 | | | | | | | |
| | 1.8 | M | L | MOVE PTi | 1 | S | MOVE PR B/C | 3 | | | | | | | |
| | 2.1 | P | | PICK PTi | 1 | | PICK PR B/C | 3 | L | PICK PEB/C | 3x | | | | |
| | 1.8 | M | L | MOVE BARC | 1 | L | MOVE PTp | 3x | L | MOVE DEV | 1x/2x | | | | |
| | 2.1 | P/D | O | PICK BARC | 1 | | DROP PTp | | O | PICK DEV | 1x/2x | | | | |
| | 0 | M | | | | | | | | | | | | | |
| | 2.1 | D/P | | DROP BARC | 1 | | | | L | DROP DEV | 1x/2x | | | | |
| | 1.8 | M | L | MOVE BARC B/C | 3 | L | MOVE PR | 2 | L | MOVE PTo | 1x | | | | |
| | 2.1 | P/D | S | DROP BARC B/C | 3 | | | | | DROP PTo | 1x | | | | |
| | 1.0 | M | | M BARC B/C | 3 | | PICK PR | 2 | | | | | | | |
| | 2.1 | D/P | | PICK BARC B/C | 3 | | | | | | | | | | |

TOTAL PROCESS TIME FOR 3 LOTS WITH NO CASCADING

TOTAL PROCESS TIME FOR 3 LOTS WITH CASCADING

SCHEDULING METHOD FOR PROCESSING EQUIPMENT

CROSS-REFERENCE TO RELATED APPLICATIONS

This application claims benefit of U.S. Provisional Patent Application No. 60/806,906, filed Jul. 10, 2006, which is herein incorporated by reference. This application is related to U.S. patent application Ser. No. 11/775,365, filed Jul. 10, 2007 and U.S. patent application Ser. No. 11/775,368, filed Jul. 10, 2007.

BACKGROUND OF THE INVENTION

1. Field of the Invention

Embodiments of the invention as recited in the claims generally relate to an integrated processing system containing multiple processing stations and robots that are capable of processing multiple substrates in parallel. In particular, the invention relates to scheduling methods for an integrated processing system.

2. Description of the Related Art

The process of forming electronic devices is commonly done in a multi-chamber processing system (e.g., a cluster tool) that has the capability to sequentially process substrates, (e.g., semiconductor wafers) in a controlled processing environment. A typical cluster tool used to deposit (i.e., coat) and develop a photoresist material, commonly known as a track lithography tool, will include a mainframe that houses at least one substrate transfer robot which transports substrates between a pod/cassette mounting device and multiple processing chambers that are connected to the mainframe. Cluster tools are often used so that substrates can be processed in a repeatable way in a controlled processing environment. A controlled processing environment has many benefits which include minimizing contamination of the substrate surfaces during transfer and during completion of the various substrate processing steps. Processing in a controlled environment thus reduces the number of generated defects and improves device yield.

The effectiveness of a substrate fabrication process is often measured by two related and important factors, which are device yield and the cost of ownership (CoO). These factors are important since they directly affect the cost to produce an electronic device and thus a device manufacturer's competitiveness in the market place. The CoO, while affected by a number of factors, is greatly affected by the system and chamber throughput, or simply the number of substrates per hour processed using a desired processing sequence. A process sequence is generally defined as the sequence of device fabrication steps, or process recipe steps, completed in one or more processing chambers in the cluster tool. A process sequence may generally contain various substrate (or wafer) electronic device fabrication processing steps. In an effort to reduce CoO, electronic device manufacturers often spend a large amount of time trying to enhance the process sequence and chamber processing time to achieve the greatest substrate throughput possible given the cluster tool architecture limitations and the chamber processing times. In track lithography type cluster tools, since the chamber processing times tend to be rather short, (e.g., about a minute to complete the process) and the number of processing steps required to complete a typical process sequence is large, a significant portion of the time it takes to complete the processing sequence is taken up transferring the substrates between the various processing chambers.

A typical track lithography process sequence will generally include the following steps: depositing one or more uniform photoresist (or resist) layers on the surface of a substrate, then transferring the substrate out of the cluster tool to a separate stepper or scanner tool to pattern the substrate surface by exposing the photoresist layer to a photoresist modifying electromagnetic radiation, and then developing the patterned photoresist layer. If the substrate throughput in a cluster tool is not robot limited, the longest process recipe step will generally limit the throughput of the processing sequence. This is usually not the case in track lithography process sequences, due to the short processing times and large number of processing steps. Typical system throughput for the conventional fabrication processes, such as a track lithography tool running a typical process, will generally be between 100-120 substrates per hour.

Other important factors in the CoO calculation are the system reliability and system uptime. These factors are very important to a cluster tool's profitability and/or usefulness, since the longer the system is unable to process substrates the more money is lost by the user due to the lost opportunity to process substrates in the cluster tool. Therefore, cluster tool users and manufacturers spend a large amount of time trying to develop reliable processes, reliable hardware, and reliable systems that have increased uptime.

The push in the industry to shrink the size of semiconductor devices to improve device processing speed and reduce the generation of heat by the device, has caused the industry's tolerance to process variability to diminish. Due to the shrinking size of semiconductor devices and the ever increasing device performance requirements, the allowable variability of the device fabrication process uniformity and repeatability has greatly decreased. To minimize process variability an important factor in the track lithography processing sequences is the issue of assuring that every substrate run through a cluster tool has the same "wafer history." A substrate's wafer history is generally monitored and controlled by process engineers to assure that all of the device fabrication processing variables that may later affect a device's performance are controlled, so that all substrates in the same batch are always processed the same way. To assure that each substrate has the same "wafer history" requires that each substrate experiences the same repeatable substrate processing steps (e.g., consistent coating process, consistent hard bake process, consistent chill process, etc.) and the timing between the various processing steps is the same for each substrate. Lithography type device fabrication processes can be especially sensitive to variations in process recipe variables and the timing between the recipe steps, which directly affects process variability and ultimately device performance.

Therefore, there is a need for a system, a method, and an apparatus that can process a substrate so that it can meet the required device performance goals and increase the system throughput while maintaining a constant "wafer history" and thus reduce the process sequence CoO.

SUMMARY OF THE INVENTION

Embodiments of the invention as recited in the claims generally provide a method for processing substrates using a multi-chamber processing system (e.g., a cluster tool) that has an increased system throughput and repeatable wafer processing history.

In one embodiment a method for transferring a substrate in a cluster tool is provided. A first substrate is transferred from a first position to a second position and then the first substrate is transferred from the second position to a third position using a first robot assembly. A second substrate is transferred from a first position to a second position and then the second substrate is transferred from the second position to a third position using a second robot assembly. The movement of the first and second robots is synchronized so that the movement from the first position to the second position by the first and second robot assembly is performed within a first time interval. The movement of the first and second robots is synchronized so that the movement from the second position to the third position by the first and second robots is performed within a second time interval. In one embodiment, the first time interval and the second time interval are distinct and non-overlapping.

In another embodiment, a method of transferring a substrate in a cluster tool is provided. A first substrate is transferred using a first robot assembly, wherein transferring the first substrate comprises removing the first substrate from a first processing chamber and placing the first substrate in a second processing chamber. A second substrate is transferred using a second robot assembly, wherein transferring the second substrate comprises removing the second substrate from a third processing chamber and placing the second substrate in a fourth processing chamber. The removing the first substrate is synchronized with the removing the second substrate or placing the second substrate. The placing the first substrate is synchronized with the removing the second substrate or placing the second substrate. The transferring the first substrate and the transferring the second substrate are completed within a first period of time.

In yet another embodiment, a cluster tool for processing one or more substrates is provided. The cluster tool comprises a first processing rack containing vertical stacks of substrate processing chambers, a first robot disposed adjacent to the first processing rack, wherein the first robot is adapted to transfer a substrate among the substrate processing chambers, and a second robot disposed adjacent the first processing rack, wherein the second robot is adapted to transfer a substrate between the substrate processing chambers in the first processing rack. The cluster tool further comprises a controller configured for defining a process sequence containing a plurality of substrate transfer steps, wherein the plurality of substrate transfer steps are adapted to aid in the movement of one or more substrates through the substrate processing chambers contained in the cluster tool, distributing at least one of the substrate transfer steps contained in the process sequence to a first robot and at least one of the substrate transfer steps contained in the process sequence to a second robot, synchronizing the movement of the first robot and the second robot so that each substrate transfer step performed by the first robot and each of the substrate transfer steps performed by the second robot that overlap in time both are performed within a first time interval, wherein the next substrate transfer step performed by the first robot and the second robot will not start until the after the first time interval is completed and the next substrate transfer step is performed within a second time interval, and executing the transfer steps.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1C is a side view illustrating a first processing rack in accordance with one embodiment of the present invention;

FIG. 3A is a master move table for a three robot system in accordance with one embodiment of the present invention;

FIG. 3B is another master move table for a three robot system in accordance with one embodiment of the present invention;

FIGS. 8A-8C are robot move tables for the first robot assembly 11A, the second robot assembly 11B, and the third robot assembly 11C respectively;

FIG. 9 is another master move table for a three robot system in accordance with one embodiment of the present invention;

Figure 1A:
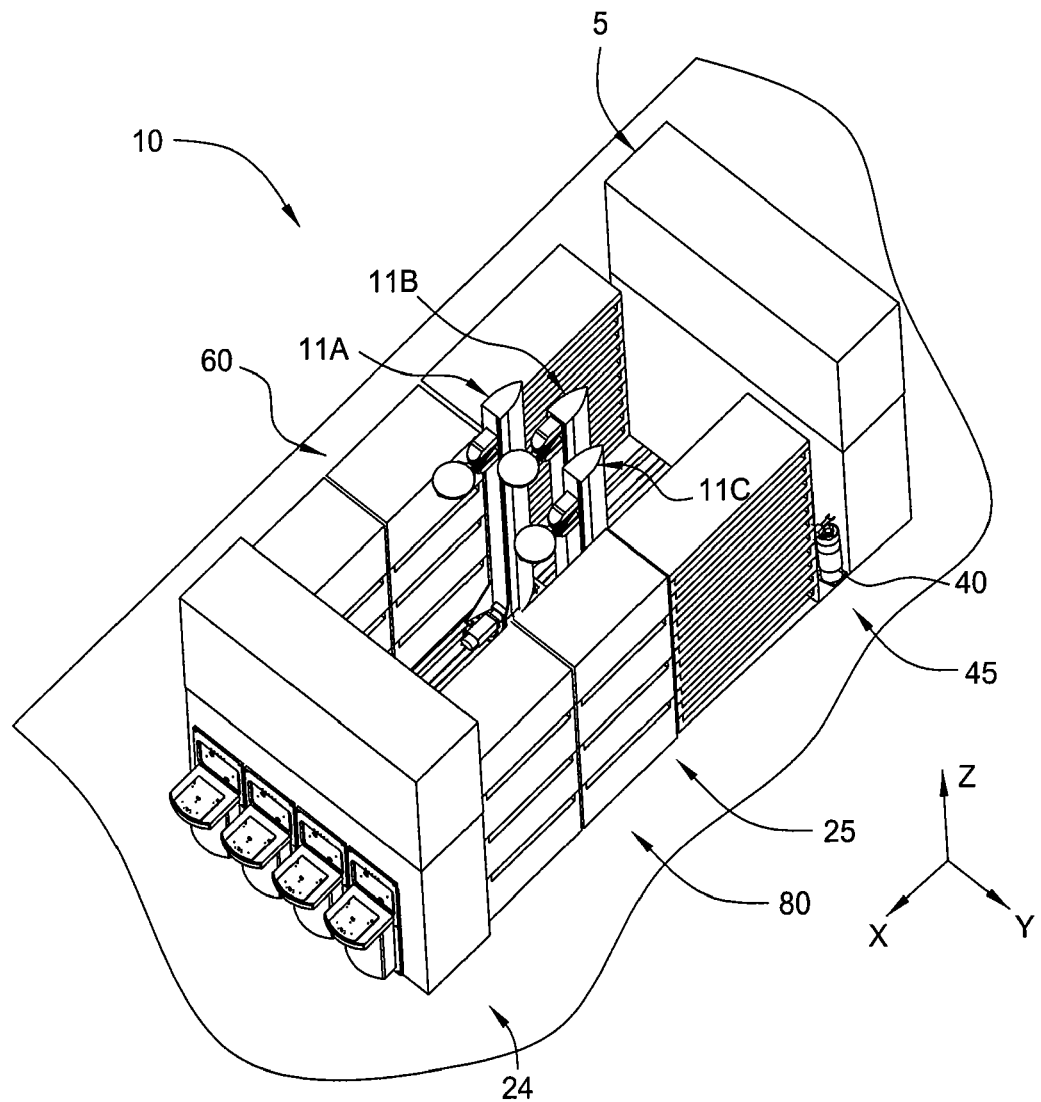
FIG. 1A is an isometric view illustrating a processing system in accordance with one embodiment of the present invention.

To facilitate understanding, identical reference numerals have been used, wherever possible, to designate identical elements that are common to the figures. It is contemplated that elements and/or process steps of one embodiment may be beneficially incorporated in other embodiments without additional recitation.

DETAILED DESCRIPTION

Embodiments of the invention as recited in the claims generally provide methods and apparatus for processing substrates using a multi-chamber processing system (e.g., a cluster tool) that has an increased system throughput and repeatable wafer processing history.

As used herein, the term "wafer history" generally refers to assuring that each substrate experiences the same repeatable substrate process timing, consistent exposure to process environment, and the timing between the various processing steps is the same for each substrate. A substrate's wafer history is generally monitored and controlled by process engineers to assure that all of the device fabrication processing variables that may later affect a device's performance are controlled, so that all substrates in the same batch are always processed the same way.

As used herein, the terms "beat frequency" or "beat period" generally refer to a type of scheduling logic in which the robots in a cluster tool transfer and/or position substrates within set time intervals. Referring to the three robot system described herein, all three robots complete their transfer moves within the same time period, or beat. For example, movement between different chamber positions and pick/drop movements are done within the set interval or "beat." Each "beat" may vary in length. The sum of all "beats," or "beat period" defines the overall throughput of the tool of module for a given set of conditions. The logic used to define a series of "beats," or "beat frequency" may be applied to systems containing two or more robots.

As used herein, the term "cascading" generally refers to processing two or more lots or batches of wafers in a track system at the same time, for example, lot A and lot B. The goal of cascading is to minimize the gaps between lot A and lot B and thus increase substrate throughput, while maintaining a constant wafer history for the wafers in each lot. Minimizing the gaps between lot A and lot B increases the productivity of the cluster tool.

As used herein, the term "substrate" generally refers to any workpiece upon which film processing is performed and may be used to denote a substrate, such as a semiconductor substrate or a glass substrate, as well as other material layers formed on the substrate, such as a dielectric layer.

As used herein, the term "slack time" generally refers to "extra time." For example, if a schedule requires a task to be completed in 102 seconds and the task takes 70 seconds, the slack time is 32 seconds. The process could be delayed to start up to 32 seconds, could start immediately and wait at the end for up to 32 seconds or split the time at the start and the end.

To facilitate understanding, the following description refers to methods and apparatus using a three robot track system to perform a lithography process. However those skilled in the art will recognize that these methods and apparatus may be used with a number of different systems and processes.

A. System Configuration

FIG. 1A is an isometric view illustrating a cluster tool 10 in accordance with one embodiment of the present invention. FIG. 1A illustrates an embodiment of the cluster tool 10 which contains three robot assemblies that are adapted to access the various process chambers that are stacked vertically in a first processing rack 60 and a second processing rack 80 and an external module 5. In one aspect, when the cluster tool 10 is used to complete a photolithography processing sequence the external module 5, may be a stepper/scanner tool, that is attached to the rear region 45 to perform some additional exposure type processing step(s). One embodiment of the cluster tool 10, as illustrated in FIG. 1A, contains a front end module 24 and a central module 25.

Figure 1B:
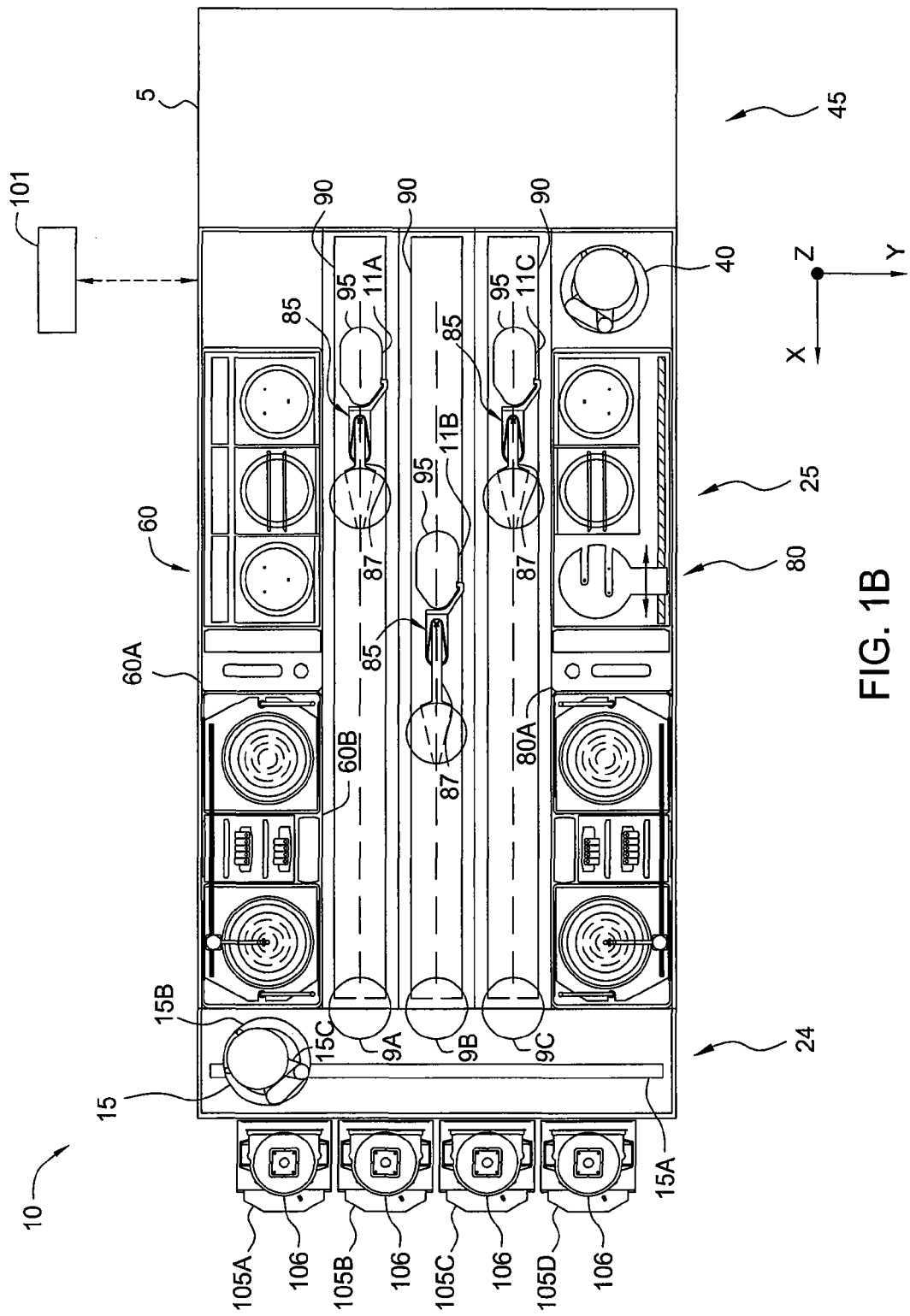
FIG. 1B is a plan view of the processing system illustrated in FIG. 1A, in accordance with one embodiment of the present invention.

FIG. 1B is a plan view of the embodiment of the cluster tool 10 shown in FIG. 1A, in accordance with one embodiment of the present invention. The front end module 24 generally contains one or more pod assemblies 105 (e.g., items 105A-D) and a front end robot assembly 15 (FIG. 1B). The one or more pod assemblies 105, or front-end opening unified pods (FOUPs), are generally adapted to accept one or more cassettes 106 that may contain one or more substrates "W", or wafers, that are to be processed in the cluster tool 10. In one aspect, the front end module 24 also contains one or more pass-through positions (e.g., elements 9A-C FIG. 1B).

In one aspect, the central module 25 has a first robot assembly 11A, a second robot assembly 11B, a third robot assembly 11C, a rear robot assembly 40, a first processing rack 60 and a second processing rack 80. The first processing rack 60 and a second processing rack 80 contain various processing chambers (e.g., coater/developer chamber, bake chamber, chill chamber, wet clean chambers, etc. which are discussed below (FIGS. 1C-D)) that are adapted to perform the various processing steps found in a substrate processing sequence.

Figure 1D:
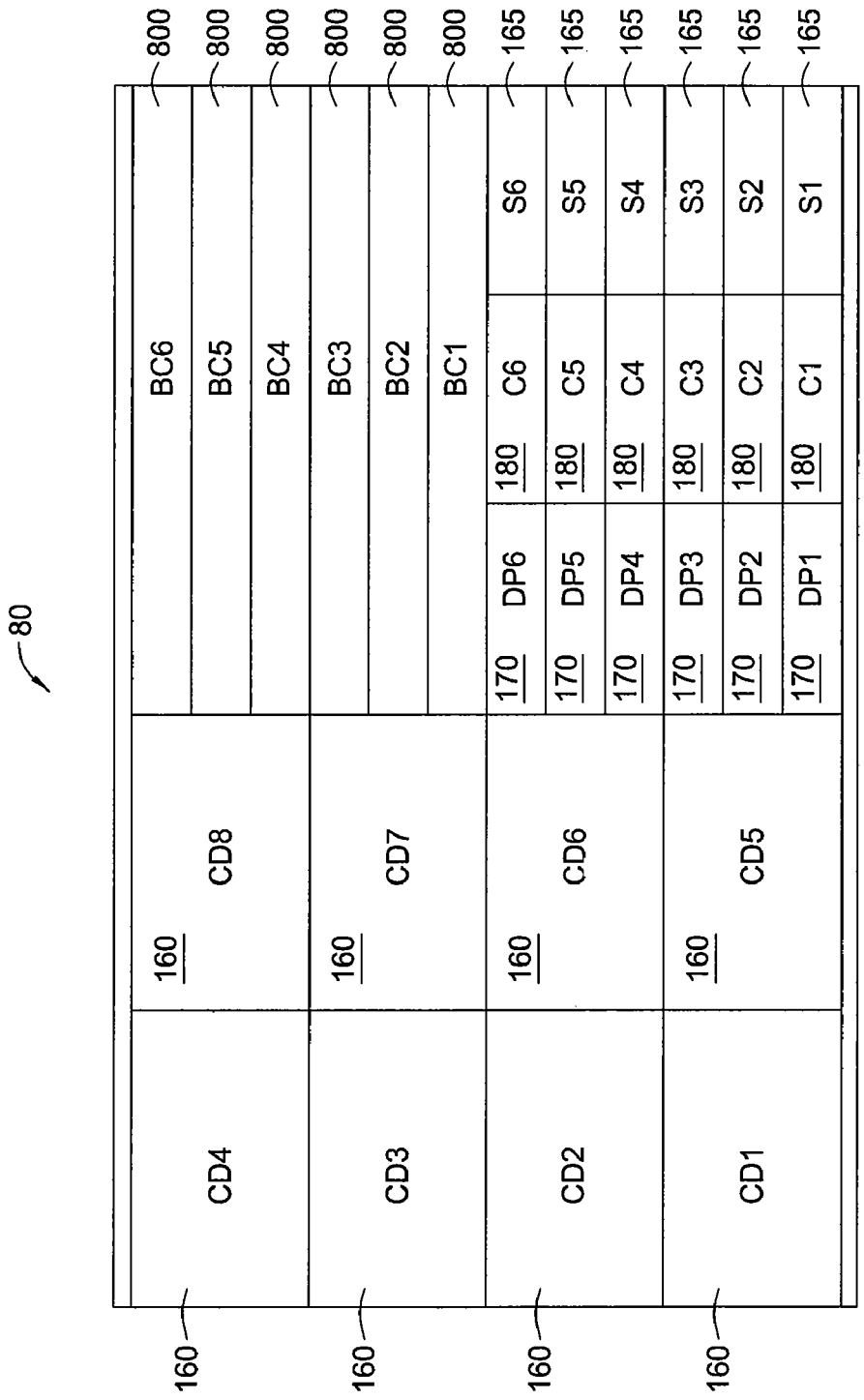
FIG. 1D is a side view illustrating a second processing rack in accordance with one embodiment of the present invention.

FIGS. 1C and 1D illustrate side views of one embodiment of the first processing rack 60 and second processing rack 80 as viewed when facing the first processing rack 60 and second processing rack 80 while standing on the side closest to side 60A. The first processing rack 60 and second processing rack 80 generally contain one or more groups of vertically stacked processing chambers that are adapted to perform some desired semiconductor or flat panel display device fabrication on a substrate. For example, in FIG. 1C the first process rack 60 has five groups, or columns, of vertically stacked processing chambers. In general these device fabrication processes may include depositing a material on a surface of the substrate, cleaning a surface of the substrate, etching a surface of the substrate, or exposing the substrate to some form of radiation to cause a physical or chemical change to one or more regions on the substrate.

In certain embodiments, the first processing rack 60 and second processing rack 80 have one or more processing chambers contained in them that can be adapted to perform one or more photolithography processing sequence steps. In one aspect, processing racks 60 and 80 may contain one or more coater/developer chambers 160, one or more chill chambers 180, one or more bake chambers 190, one or more optical edge bead removal (OEBR) chambers 162, one or more post exposure bake (PEB) chambers 130, one or more support chambers 165, an integrated bake/chill chamber (not shown), and/or one or more hexamethyldisilazane (HMDS) processing chambers 170. Exemplary coater/developer chambers, chill chambers, bake chambers, OEBR chambers, PEB chambers, support chambers, integrated bake/chill chambers and/or HMDS processing chambers that may be adapted to benefit one or more aspects of the invention are further described in the commonly assigned U.S. patent application Ser. No. 11/112,281, filed Apr. 22, 2005, published as US 2006-0130750, which is hereby incorporated by reference in its entirety to the extent not inconsistent with the claimed invention. Examples of an integrated bake/chill chamber that may be adapted to benefit one or more aspects of the invention are further described in the commonly assigned U.S. patent application Ser. No. 11/111,154, filed Apr. 11, 2005, published as US 2006-0134340, and U.S. patent application Ser. No. 11/111,353, filed Apr. 11, 2005, published as US 2006-0130747, which are hereby incorporated by reference in their entirety to the extent not inconsistent with the claimed invention.

Examples of processing chambers and or systems that may be adapted to perform one or more cleaning processes on a substrate and may be adapted to benefit one or more aspects of the invention is further described in the commonly assigned U.S. patent application Ser. No. 09/891,849, filed Jun. 25, 2001, published as US 2002-0029788, and U.S. patent application Ser. No. 09/945,454, filed Aug. 31, 2001, published as US 2003-0045098, which are hereby incorporated by reference in their entirety to the extent not inconsistent with the claimed invention.

In one embodiment, as shown in FIG. 1C, where the cluster tool 10 is adapted to perform a photolithography type process, the first processing rack 60 may have eight coater/developer chambers 160 (labeled CD1-8), eighteen chill chambers 180 (labeled C1-18), eight bake chambers 190 (labeled B1-8), six PEB chambers 130 (labeled PEB1-6), two OEBR chambers 162 (labeled 162) and/or six HMDS process chambers 170 (labeled DP1-6). In one embodiment, as shown in FIG. 1D, where the cluster tool 10 is adapted to perform a photolithography type process, the second process rack 80 may have eight coater/developer chambers 160 (labeled CD1-8), six integrated bake/chill chambers 800 (labeled BC1-6), six HMDS process chambers 170 (labeled DP1-6) and/or six support chambers 165 (labeled S1-6). The orientation, positioning, type, and number of process chambers shown in the FIGS. 1C-D are not intended to be limiting as to the scope of the invention, but are intended to illustrate an embodiment of the invention.

Referring to FIG. 1B, in one embodiment, the front end robot assembly 15 is adapted to transfer substrates between a cassette 106 mounted in a pod assembly 105 (see elements 105A-D) and the one or more of the pass-through positions (see pass-through positions 9A-C in FIG. 1B). In another embodiment, the front end robot assembly 15 is adapted to transfer substrates between a cassette mounted in a pod assembly 105 and the one or more processing chambers in the first processing racks 60 or a second processing rack 80 that abuts the front end module 24. The front end robot assembly 15 generally contains a horizontal motion assembly 15A and a robot 15B, which in combination are able to position a substrate in a desired horizontal and/or vertical position in the front end module 24 or the adjoining positions in the central module 25. The front end robot assembly 15 is adapted to transfer one or more substrates using one or more robot blades 15C, by use commands sent from a system controller 101 (discussed below). In one sequence the front end robot assembly 15 is adapted to transfer a substrate from the cassette 106 to one of the pass-through positions (e.g., elements 9A-C in FIG. 1B). Generally, a pass-through position is a substrate staging area that may contain a pass-through processing chamber that has features similar to an exchange chamber 533, or a conventional substrate cassette 106, and is able to accept a substrate from a first robot assembly so that it can be removed and repositioned by a second robot assembly. In one aspect, the pass-through processing chamber mounted in a pass-through position may be adapted to perform one or more processing steps in a desired processing sequence, for example, a HMDS process step or a chill/cooldown processing step or substrate notch align. In one aspect, each of the pass-through positions (elements 9A-C in FIG. 1B) may be accessed by each of the central robot assemblies (i.e., first robot assembly 11A, second robot assembly 11B, and third robot assembly 11C).

Referring to FIGS. 1A-B, the first robot assembly 11A, the second robot assembly 11B, and the third robot assembly 11C are adapted to transfer substrates to the various processing chambers contained in the first processing rack 60 and the second processing rack 80. In one embodiment, to perform the process of transferring substrates in the cluster tool 10 the first robot assembly 11A, the second robot assembly 11B, and the third robot assembly 11C have similarly configured robot assemblies 11 which each have at least one horizontal motion assembly 90, a vertical motion assembly 95, and a robot hardware assembly 85 which are in communication with a system controller 101. In one aspect, the side 60B of the first processing rack 60, and the side 80A of the second processing rack 80 are both aligned along a direction parallel to the horizontal motion assembly 90 (described below) of each of the various robot assemblies (i.e., first robot assembly 11A, second robot assembly 11B, third robot assembly 11C).

The system controller 101 is adapted to control the position and motion of the various components used to complete the transferring process. The system controller 101 is generally designed to facilitate the control and automation of the overall system and typically includes a central processing unit (CPU) (not shown), memory (not shown), and support circuits (or I/O) (not shown). The CPU may be one of any form of computer processors that are used in industrial settings for controlling various system functions, chamber processes and support hardware (e.g., detectors, robots, motors, gas sources hardware, etc.) and monitor the system and chamber processes (e.g., chamber temperature, process sequence throughput, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 101 determines which tasks are performable on a substrate. Preferably, the program is software readable by the system controller 101 that includes code to perform tasks relating to monitoring and execution of the processing sequence tasks and various chamber process recipe steps.

Figure 1E:
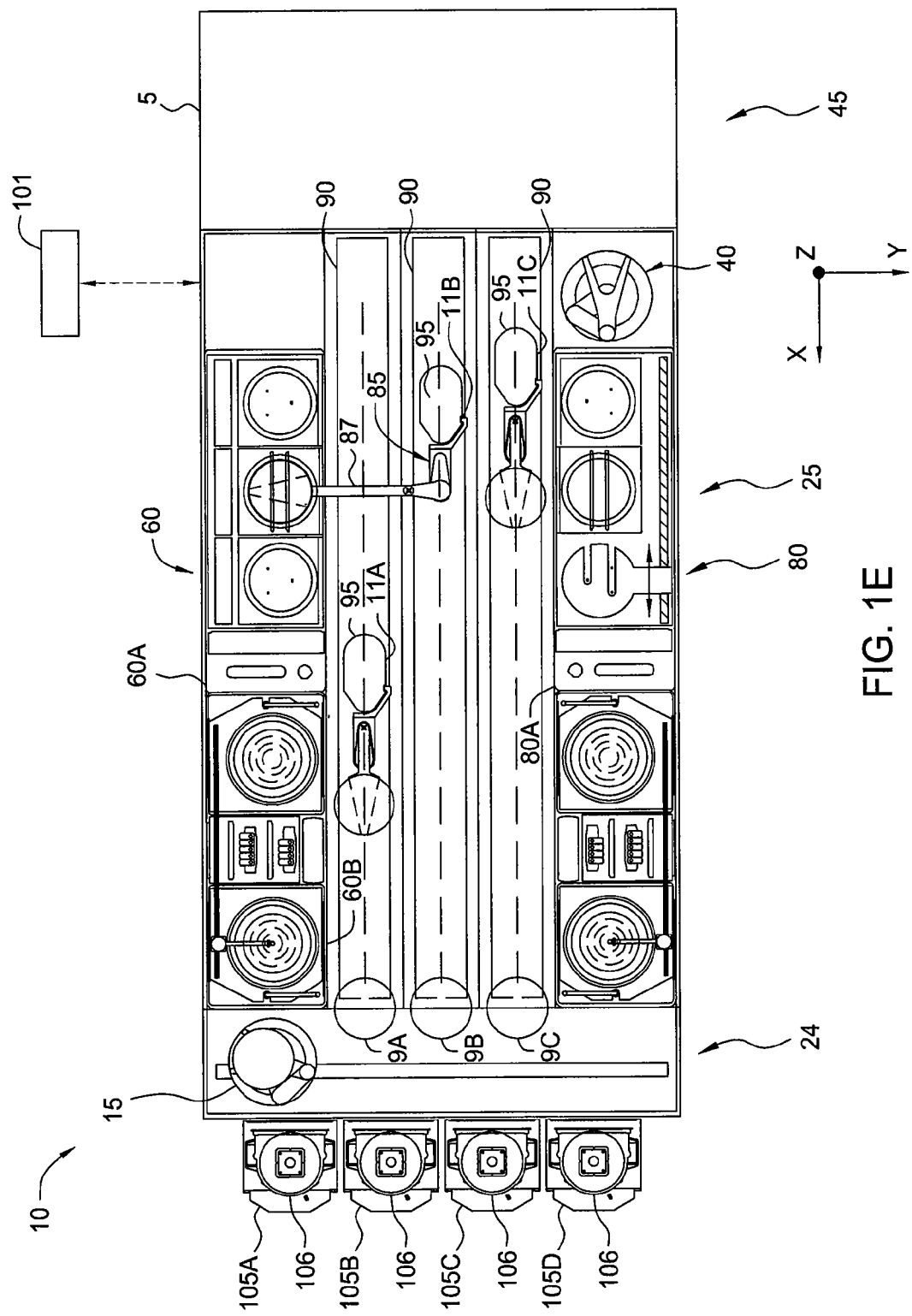
FIG. 1E is a plan view illustrating the processing system in FIG. 1B, in accordance with one embodiment of the present invention.

Referring to FIG. 1B, in one aspect of the invention the first robot assembly 11A is adapted to access and transfer substrates between the processing chambers in the first processing rack 60 from at least one side, e.g., the side 60B. In one aspect, the third robot assembly 11C is adapted to access and transfer substrates between the processing chambers in the second processing rack 80 from at least one side, e.g., the side 80A. In one aspect, the second robot assembly 11B is adapted to access and transfer substrates between the processing chambers in the first processing rack 60 from side 60B and the second processing rack 80 from side 80A. FIG. 1E illustrates a plan view of the embodiment of the cluster tool 10 shown in FIG. 1B, in which a robot blade 87 from the second robot assembly 11B has been extended into a processing chamber in the first processing rack 60 through side 60B. The ability to extend the robot blade 87 into a processing chamber and retract the robot blade 87 from the processing chamber is generally completed by cooperative movement of the components contained in the horizontal motion assembly 90, vertical motion assembly 95, and robot hardware assembly 85, and by use of commands sent from the system controller 101. The ability of two or more robots to "overlap" with one another, such as the first robot assembly 11A and the second robot assembly 11B or the second robot assembly 11B and the third robot assembly 11C, is advantageous since it allows substrate transfer redundancy which can improve the cluster reliability, uptime, and also increase the substrate throughput. Robot "overlap" is generally the ability of two or more robots to access and/or independently transfer substrates between the same processing chambers in the processing rack. The ability of two or more robots to redundantly access processing chambers can be an important aspect in preventing system robot transfer bottlenecks, since it allows an under utilized robot to help out a robot that is limiting the system throughput. Therefore, the substrate throughput can be increased, a substrate's wafer history can be made more repeatable, and the system reliability can be improved through the act of balancing the load that each robot takes during the processing sequence.

In one aspect of the invention, the various overlapping robot assemblies (e.g., elements 11A, 11B, 11C, 11D, 11E, etc.) are able to simultaneously access processing chambers that are horizontally adjacent (x-direction) or vertically adjacent (z-direction) to each other. For example, when using the cluster tool configurations illustrated in FIGS. 1B and 1C, the first robot assembly 11A is able to access processing chamber CD6 in the first processing rack 60 and the second robot assembly 11B is able to access processing chamber CD5 simultaneously without colliding or interfering with each other. In another example, when using the cluster tool configurations illustrated in FIGS. 1B and 1D, the third robot assembly 11C is able to access processing chamber C6 in the second processing rack 80 and the second robot assembly 11B is able to access processing chamber P6 simultaneously without colliding or interfering with each other.

In one aspect, the system controller 101 is adapted to adjust the substrate transfer sequence through the cluster tool based on a calculated optimized throughput or to work around processing chambers that have become inoperable. A feature of the system controller 101 which enhances throughput is known as the logical scheduler. The logical scheduler prioritizes tasks and substrate movements based on inputs from the user and various sensors distributed throughout the cluster tool. The logical scheduler may be adapted to review the list of future tasks requested of each of the various robots (e.g., front end robot assembly 15, first robot assembly 11A, second robot assembly 11B, third robot assembly 11C, etc.), which are retained in the memory of the system controller 101, to help balance the load placed on each of the various robots. The use of a system controller 101 to maximize the utilization of the cluster tool will improve the cluster tool's CoO, makes the wafer history more repeatable, and can improve the cluster tool's reliability.

In one aspect, the system controller 101 is also adapted to prevent collisions between the various overlapping robots and increase the substrate throughput. In one aspect, the system controller 101 is further programmed to monitor and control the motion of the horizontal motion assembly 90, a vertical motion assembly 95, and a robot hardware assembly 85 of all the robots in the cluster tool to avoid a collision between the robots and improve system throughput by allowing all of the robots to be in motion at the same time. This so called "collision avoidance system," may be implemented in multiple ways, but in general the system controller 101 monitors the position of each of the robots by use of various sensors positioned on the robot(s) or in the cluster tool during the transferring process to avoid a collision. In one aspect, the system controller is adapted to actively alter the motion and/or trajectory of each of the robots during the transferring process to avoid a collision and minimize the transfer path length. Examples of other cluster tool systems are disclosed in commonly assigned U.S. patent application Ser. No. 11/315,984, filed Dec. 22, 2005, and published as US 2006-0182536, which is hereby incorporated by reference in its entirety to the extent not inconsistent with the claimed invention.

B. Transfer Sequence Example

Figure 1F:
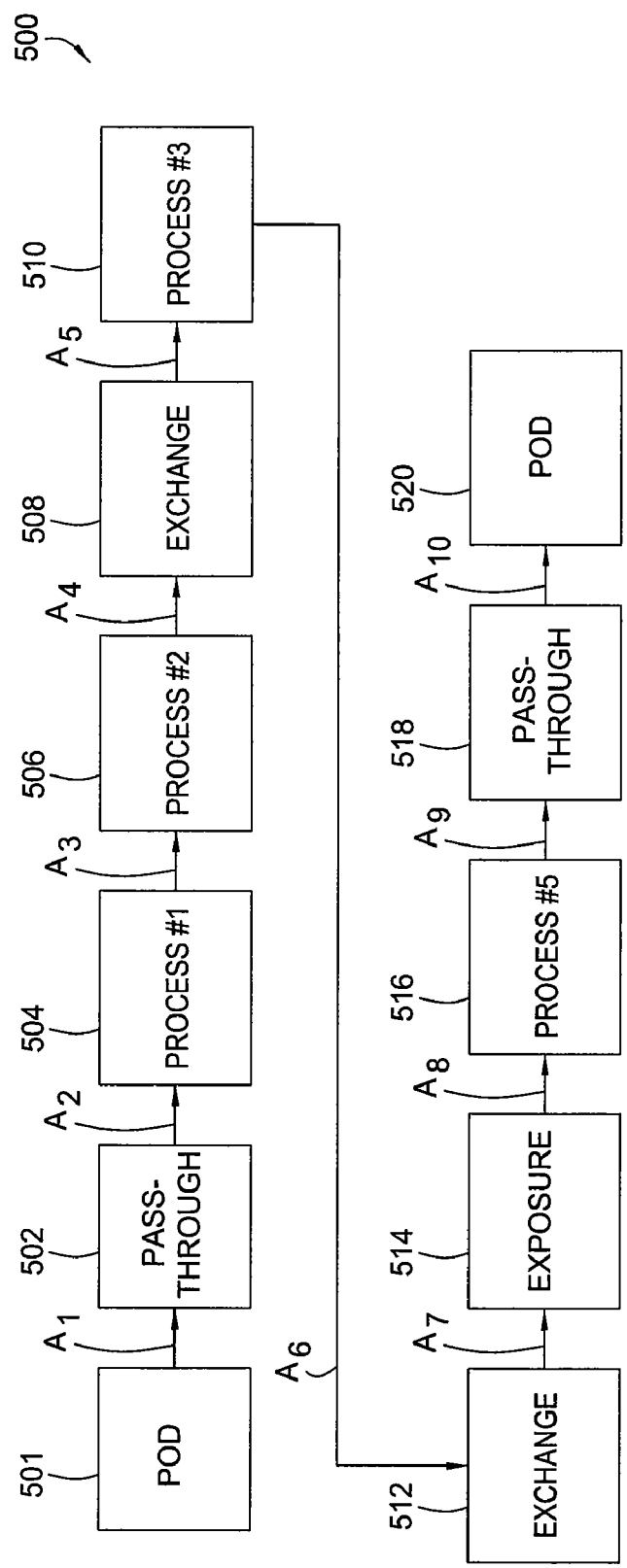
FIG. 1F is a flow diagram illustrating a process sequence containing various process recipe steps that may be used in conjunction with the various embodiments of the cluster tool described herein.

FIG. 1F illustrates one example of a substrate processing sequence 500 through the cluster tool 10, where a number of process steps (e.g., elements 501-520) may be performed after each of the transferring steps $A_1$-$A_{10}$ have been completed. One or more of the process steps 501-520 may entail performing vacuum and/or fluid processing steps on a substrate, to deposit a material on a surface of the substrate, to clean a surface of the substrate, to etch a surface of the substrate, or to exposing the substrate to some form of radiation to cause a physical or chemical change to one or more regions on the substrate. Examples of typical processes that may be performed are photolithography processing steps, substrate clean process steps, CVD deposition steps, ALD deposition steps, electroplating process steps, or electroless plating process steps.

The substrate processing sequence 500 may be a photolithographic process. The photolithographic process may generally contain the following: a remove substrate from pod step, a BARC coat step, a post BARC bake step, a post BARC chill step, a photoresist coat step, a post photoresist coat bake step, a post photoresist chill step, an optical edge bead removal (OEBR) step, an exposure step, a post exposure bake (PEB) step, a post PEB chill step, a develop step, and a place in pod step. In other embodiments, the sequence of the method steps 500 may be rearranged, altered, one or more steps may be removed, or two or more steps may be combined into a single step without varying from the basic scope of the invention.

The remove substrate from pod step is generally defined as the process of having the front end robot 15 remove a substrate from a cassette 106 resting in one of the pod assemblies 105. A cassette 106, containing one or more substrates "W", is placed on the pod assembly 105 by the user or some external device (not shown) so that the substrates can be processed in the cluster tool 10 by a user-defined substrate processing sequence controlled by software retained in the system controller 101.

The BARC coat step, or bottom anti-reflective coating process (hereafter BARC), is used to deposit an organic material over a surface of the substrate. The BARC layer is typically an organic coating that is applied onto the substrate prior to the photoresist layer to absorb light that otherwise would be reflected from the surface of the substrate back into the photoresist during the exposure step performed in the stepper/scanner. If these reflections are not prevented, optical standing waves will be established in the photoresist layer, which cause feature size(s) to vary from one location to another depending on the local thickness of the photoresist layer. The BARC layer may also be used to level (or planarize) the substrate surface topography, since surface topography variations are invariably present after completing multiple electronic device fabrication steps. The BARC material fills around and over the features to create a flatter surface for photoresist application and reduces local variations in photoresist thickness. The BARC coat step is typically performed using a conventional spin-on photoresist dispense process in which an amount of the BARC material is deposited on the surface of the substrate while the substrate is being rotated, which causes a solvent in the BARC material to evaporate and thus causes the material properties of the deposited BARC material to change. The air flow and exhaust flow rate in the BARC processing chamber is often controlled to control the solvent vaporization process and the properties of the layer formed on the substrate surface.

The post BARC bake step is used to assure that all of the solvent is removed from the deposited BARC layer in the BARC coat step, and in some cases to promote adhesion of the BARC layer to the surface of the substrate. The temperature of the post BARC bake step is dependent on the type of BARC material deposited on the surface of the substrate, but will generally be less than about 250° C. The time required to complete the post BARC bake step will depend on the temperature of the substrate during the post BARC bake step, but will generally be less than about 60 seconds.

The post BARC chill step, is used to assure that the time the substrate is at a temperature above ambient temperature is controlled so that every substrate sees the same time-temperature profile; thus process variability is minimized. Variations in the BARC process time-temperature profile, which is a component of a substrate's wafer history, can have an effect on the properties of the deposited film layer and thus is often controlled to minimize process variability. The post BARC chill step is typically used to cool the substrate after the post BARC bake step to a temperature at or near ambient temperature. The time required to complete the post BARC chill step will depend on the temperature of the substrate exiting the post BARC bake step, but will generally be less than about 30 seconds.

The photoresist coat step is used to deposit a photoresist layer over a surface of the substrate. The photoresist layer deposited during the photoresist coat step is typically a light sensitive organic coating that is applied onto the substrate and is later exposed in the stepper/scanner to form the patterned features on the surface of the substrate. The photoresist coat step is typically performed using conventional spin-on photoresist dispense process in which an amount of the photoresist material is deposited on the surface of the substrate while the substrate is being rotated, thus causing a solvent in the photoresist material to evaporate and the material properties of the deposited photoresist layer to change. The air flow and exhaust flow rate in the photoresist processing chamber is controlled to control the solvent vaporization process and the properties of the layer formed on the substrate surface. In some cases it may be necessary to control the partial pressure of the solvent over the substrate surface to control the vaporization of the solvent from the photoresist during the photoresist coat step by controlling the exhaust flow rate and/or by injecting a solvent near the substrate surface. To complete the photoresist coat step the substrate is first positioned on a spin chuck in a coater chamber. A motor rotates the spin chuck and substrate while the photoresist is dispensed onto the center of the substrate. The rotation imparts an angular torque onto the photoresist, which forces the photoresist out in a radial direction, ultimately covering the substrate.

The post photoresist coat bake step is used to assure that most, if not all, of the solvent is removed from the deposited photoresist layer in the photoresist coat step, and in some cases to promote adhesion of the photoresist layer to the BARC layer. The temperature of the post photoresist coat bake step is dependent on the type of photoresist material deposited on the surface of the substrate, but will generally be less than about 250° C. The time required to complete the post photoresist coat bake step will depend on the temperature of the substrate during the post photoresist bake step, but will generally be less than about 60 seconds.

The post photoresist chill step is used to control the time the substrate is at a temperature above ambient temperature so that every substrate sees the same time-temperature profile and thus process variability is minimized. Variations in the time-temperature profile can have an affect on properties of the deposited film layer and thus is often controlled to minimize process variability. The temperature of the post photoresist chill step is thus used to cool the substrate after the post photoresist coat bake step to a temperature at or near ambient temperature. The time required to complete the post photoresist chill step will depend on the temperature of the substrate exiting the post photoresist bake step, but will generally be less than about 30 seconds.

The optical edge bead removal (OEBR) step, is a process used to expose the deposited light sensitive photoresist layer (s), such as the layers formed during the photoresist coat step and the BARC layer formed during the BARC coat step, to a radiation source (not shown) so that either or both layers can be removed from the edge of the substrate and the edge exclusion of the deposited layers can be more uniformly controlled. The wavelength and intensity of the radiation used to expose the surface of the substrate will depend on the type of BARC and photoresist layers deposited on the surface of the substrate. An OEBR tool can be purchased, for example, from USHIO America, Inc. Cypress, Calif.

The exposure step is a lithographic projection step applied by a lithographic projection apparatus (e.g., stepper scanner) to form a pattern which is used to manufacture integrated circuits (ICs). The exposure step forms a circuit pattern corresponding to an individual layer of the integrated circuit (IC) device on the substrate surface, by exposing the photosensitive materials, such as, the photoresist layer formed during the photoresist coat step and the BARC layer formed during the BARC coat step (photoresist) of some form of electromagnetic radiation. The stepper/scanner may be purchased from Cannon, Nikon, or ASML.

The post exposure bake (PEB) step is used to heat a substrate immediately after the exposure step in order to stimulate diffusion of the photoactive compound(s) and reduce the effects of standing waves in the photoresist layer. For a chemically amplified photoresist, the PEB step also causes a catalyzed chemical reaction that changes the solubility of the photoresist. The control of the temperature during the PEB is critical to critical dimension (CD) control. The temperature of the PEB step is dependent on the type of photoresist material deposited on the surface of the substrate, but will generally be less than about 250° C. The time required to complete the PEB step will depend on the temperature of the substrate during the PEB step, but will generally be less than about 60 seconds.

The post exposure bake (PEB) chill step is used to assure that the time the substrate is at a temperature above ambient temperature is controlled, so that every substrate sees the same time-temperature profile and thus process variability is minimized. Variation in the PEB process time-temperature profile can have an effect on properties of the deposited film layer and thus is often controlled to minimize process variability. The temperature of the post PEB chill step is thus used to cool the substrate after the PEB step to a temperature at or near ambient temperature. The time required to complete the post PEB chill step will depend on the temperature of the substrate exiting the PEB step, but will generally be less than about 30 seconds.

The develop step is a process in which a solvent is used to cause a chemical or physical change to the exposed or unexposed photoresist and BARC layers to expose the pattern formed during the exposure step. The develop process may be a spray or immersion or puddle type process that is used to dispense the developer solvent. In one embodiment of the develop step, after the solvent has been dispensed on the surface of the substrate a rinse step may be performed to rinse the solvent material from the surface of the substrate. The rinse solution dispensed on the surface of the substrate may contain deionized water and/or a surfactant.

The insert the substrate in pod step is generally defined as the process of having the front end robot 15 return the substrate to a cassette 106 resting in one of the pod assemblies 105.

Figure 1G:
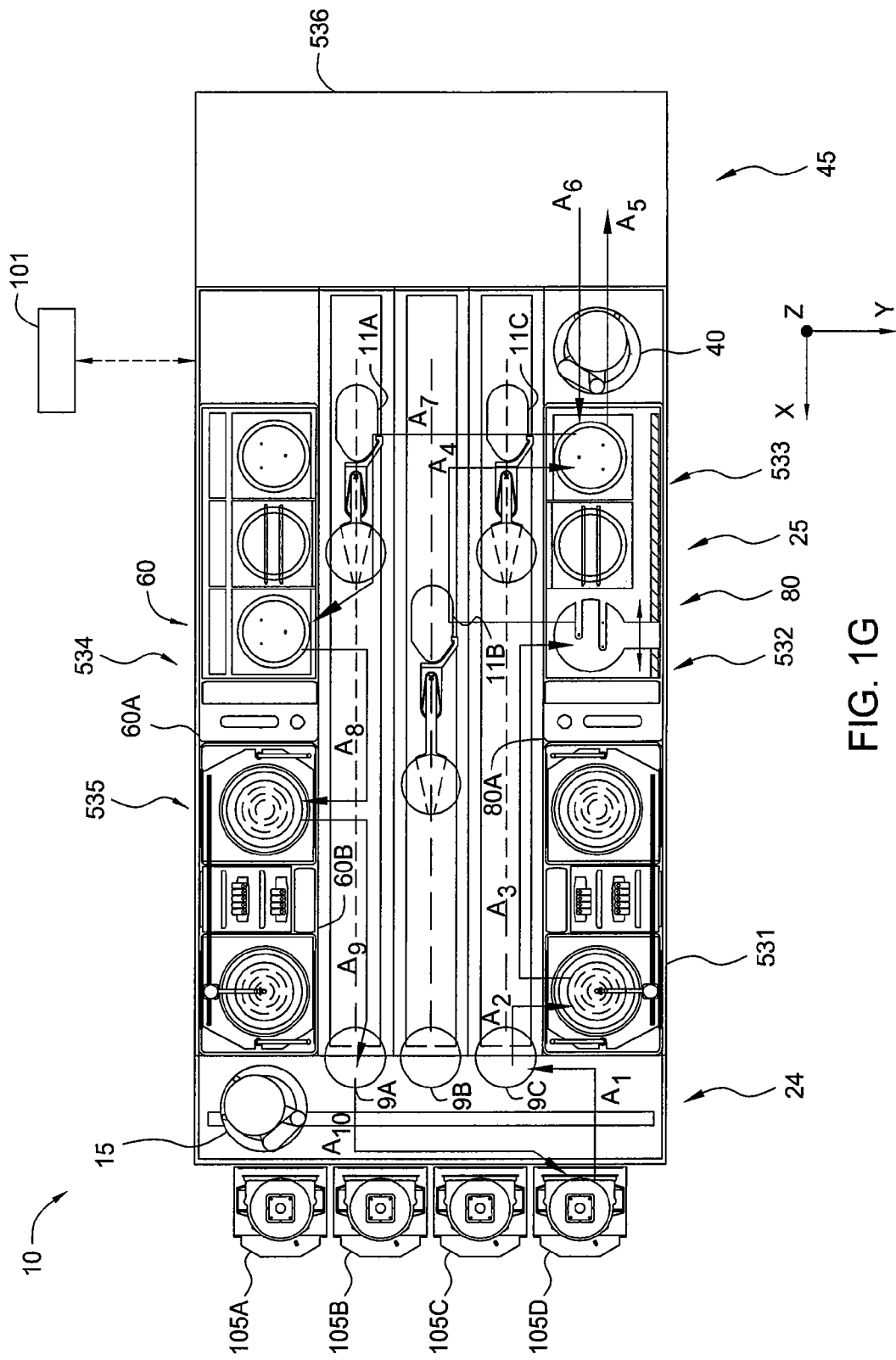
FIG. 1G is a plan view of the processing system illustrated in FIG. 1B that illustrates a transfer path of a substrate through the cluster tool following the process sequence illustrated in FIG. 1F.

FIG. 1G illustrates an example of the transfer steps that a substrate may follow as it is transferred through a cluster tool that is configured as the cluster tool shown in FIG. 1B following the processing sequence 500 described in FIG. 1F. In this embodiment, the substrate is removed from a pod assembly 105 (item #105D) by the front end robot assembly 15 and is delivered to a chamber positioned at the pass-through position 9C following the transfer path $A_1$, so that the pass-through step 502 can be completed on the substrate. In one embodiment, the pass-through step 502 entails positioning or retaining the substrate so that another robot could pickup the substrate from the pass-through position 9C. Once the pass-through step 502 has been completed, the substrate is then transferred to a first process chamber 531 by the third robot assembly 11C following the transfer path $A_2$, where process step 504 is completed on the substrate. After completing the process step 504 the substrate is then transferred to the second process chamber 532 by the third robot assembly 11C following the transfer path $A_3$. After performing the process step 506 the substrate is then transferred by the second robot assembly 11B, following the transfer path $A_4$, to the exchange chamber 533. After performing the process step 508 the substrate is then transferred by the rear robot assembly 40, following the transfer path $A_5$, to the external processing system 536 where the process step 510 is performed. After performing process step 510 the substrate is then transferred by a rear robot assembly 40, following the transfer path $A_6$, to the exchange chamber 533 where the process step 512 is performed. In one embodiment, the process steps 508 and 512 entail positioning or retaining the substrate so that another robot could pickup the substrate from the exchange chamber 533. After performing the process step 512 the substrate is then transferred by the second robot assembly 11B, following the transfer path $A_7$, to the process chamber 534 where the process step 514 is performed. The substrate is then transferred to process chamber 535 following the transfer path $A_8$ using the first robot assembly 11A. After the process step 516 is complete, the first robot assembly 11A transfers the substrate to a pass-through chamber positioned at the pass-through position 9A following the transfer path $A_9$. In one embodiment, the pass-through step 518 entails positioning or retaining the substrate so that another robot could pickup the substrate from the pass-through position 9A. After performing the pass-through step 518 the substrate is then transferred by the front end robot assembly 15, following the transfer path $A_{10}$, to the pod assembly 105D.

In one embodiment, process steps 504, 506, 510, 514, and 516 are a photoresist coat step, a bake/chill step, an exposure step performed in a stepper/scanner module, a post exposure bake/chill step, and a develop step, respectively, which are further described in the commonly assigned U.S. patent application Ser. No. 11/112,281, filed Apr. 22, 2005, published as 2006-0130750, which is incorporated by reference herein. The bake/chill step and the post exposure bake/chill steps may be performed in a single process chamber or they may also be transferred between a bake section and a chill section of an integrated bake/chill chamber by use of an internal robot (not shown). While FIGS. 1F-1G illustrate one example of a process sequence that may be used to process a substrate in a cluster tool 10, process sequences and/or transfer sequences that are more or less complex may be performed without varying from the basic scope of the invention.

Also, in one embodiment, the cluster tool 10 is not connected to or in communication with an external processing system 536 and thus the rear robot assembly 40 is not part of the cluster tool configuration and the transfer steps $A_5$-$A_6$ and process step 510 are not performed on the substrate. In this configuration all of the processing steps and transferring steps are performed between positions or processing chambers within in the cluster tool 10.

Figure 1H:
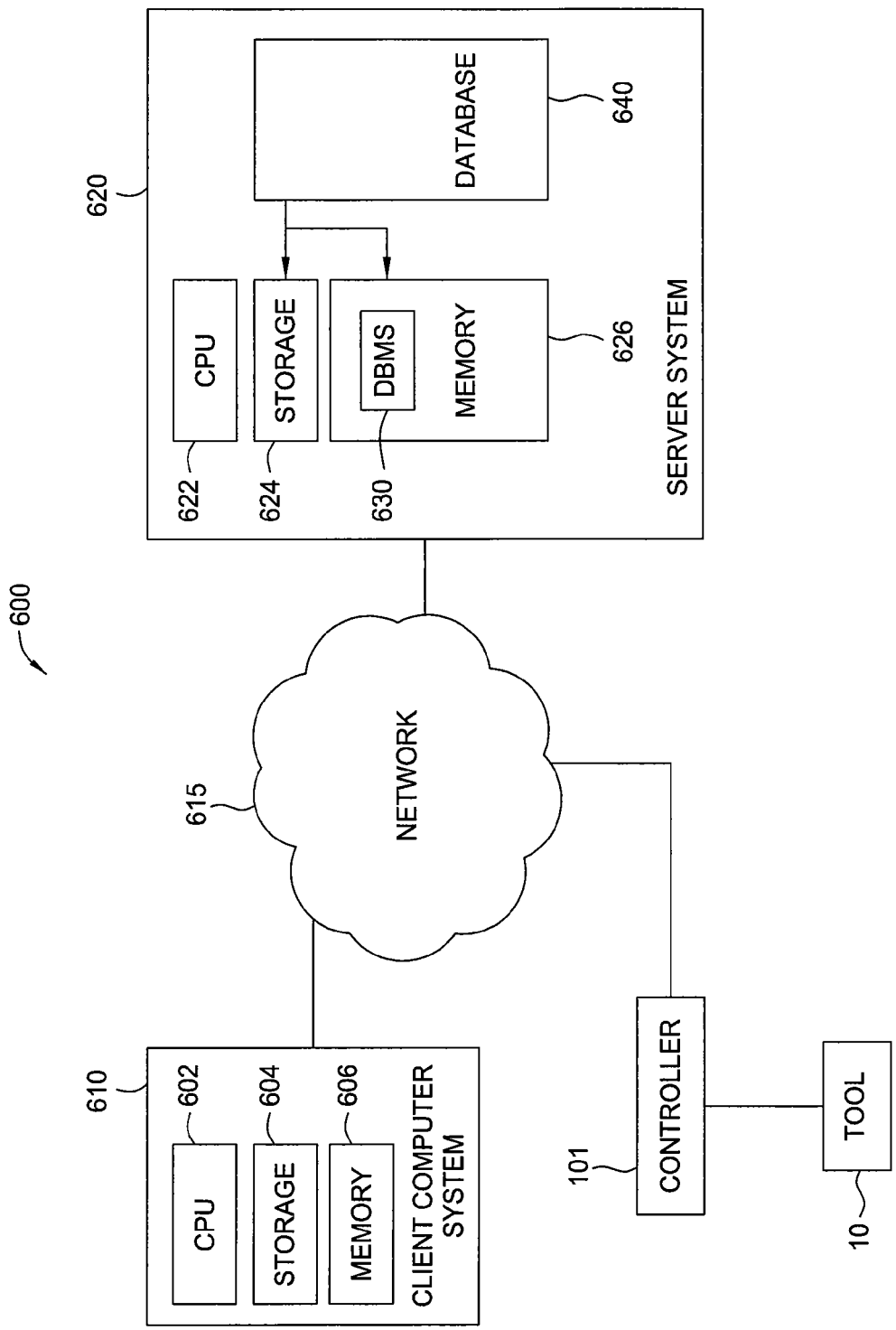
FIG. 1H is a block diagram illustrating a client server view of a computing environment and database system in accordance with one embodiment of the present invention.

FIG. 1H is a block diagram that illustrates a client server view of a computing environment 600, including controller 101, and cluster tool 10, according to one embodiment of the invention. As shown, computing environment 600 includes a client computer system 610, network 615, server system 620, and controller 101. In one embodiment, the computer systems illustrated in environment 600 may include computer existing computer systems, e.g., desktop computers, server computers laptop computers, tablet computers, and the like. The software applications described herein, however, are not limited to any particular computing system or application or network architecture and may be adapted to take advantage of new computing systems as they become available. Additionally, those skilled in the art will recognize that the computer systems shown in FIG. 1H are simplified to highlight aspects of the present invention and that computing systems and networks typically include a variety of additional elements not shown in FIG. 1H.

As shown, client computer system 610 includes a CPU 602, storage 604 and memory 606, typically connected by a bus (not shown). CPU 602 is a programmable logic device that performs all the instruction, logic, and mathematical processing in a computer. Storage 604 stores application programs and data for use by a client computer system 610. Storage 604 includes hard-disk drives, flash memory devices, optical media and the like. Network 615 generally represents any kind of data communications network. Accordingly, network 615 may represent both local and wide area networks, including the Internet.

Server 620 also includes a CPU 622, storage 624 and memory 626. As shown, sever system 620 also includes a database management system (DBMS) 630 in communication with database 640. The DBMS 630 includes software used to organize, analyze, and modify information stored in a database 640. Database 640 contains the data managed by DBMS 630. At various times elements of database 640 may be present in storage 624 and memory 626.

C. Wafer Transfer System

Beat Frequency Control

As noted above one of the key elements to a desirable process sequence performed on a substrate in a cluster tool system is the need to assure that each wafer processed has a similar wafer history. Typical conventional processing tools use algorithms or software that is often called "adaptive sequencers" to control the movement of substrates through the cluster tool. Decisions made by the adaptive sequencers are made based on demands or events that normally occur during the processing and/or during fault situations. In this configuration, to plan or control the current and future movement of wafers through the cluster tool, the system controller makes decisions based on a defined and prioritized set of rules that are applied to a situation based on the specific faults or specific events that may be occurring at that instant in time. It is thus easy to see that different actions may be taken at any given instant in time based on various process sequence variables, such as the position of the wafers in the system or the faults that have arisen during the processing of the substrate. This demand based control will cause or create a variation in the movement of wafers and the overall control of the system. Adaptive sequencers will also require a system to contain and use logic components that are able to make decisions and then control and carryout these decisions accordingly, which can be costly. Use of adaptive type sequencers will affect the wafer history experienced by each substrate and decrease wafer throughput time through the manufacturing equipment, since the timing between processing or transferring steps may vary due to task conflicts created by the changing priorities made by the adaptive sequencers.

Therefore, there is a need for a system, a method and an apparatus that can process a substrate so that it can meet the required device performance goals and increase the system throughput while maintaining constant "wafer history" and reducing the system cost and complexity. To resolve these issues the following control architecture, techniques, algorithms, and systems are used to control the substrate throughput through a cluster tool. These elements may include beat frequency control, an offline application, and wafer cascading type control, which are discussed herein.

One aspect of the control system discussed herein is the use of software and modeling techniques that allow a user to optimize and define an optimal processing sequence based on the user's goals. In general, the user defined processing sequence will be maintained or proportionally scaled so that the key goals of the user define processing sequence will not change. This is generally performed by use of an offline application that requires the user to make decisions as to what features are important to achieve a desired substrate processing sequence. These decisions may include the requirement that the wafer history for each wafer be as uniform as possible, that the throughput be as high as possible, that the wafers not wait at certain points in the processing sequence, and/or that wafers going into the system only see one robot blade while wafers leaving the system see another robot blade, to name just a few. The offline application is discussed further below.

One aspect of the process sequence control is a wafer throughput management process called beat frequency. The "beat frequency" or "beat period" refers to a type of scheduling logic in which all robots within a cluster tool transfer and/or position substrates within a series of set time intervals. This scheduling logic assures that the robot to robot interaction and substrate movement remains constant and well known since the movement or actions taken by the robots are started at the same time and are not completed until all the robots have performed the defined task within the set time interval. For example, referring to the three robot system described herein, all three robots move at the same time to a different chamber position and then each robot performs a Pick/Drop movement at the same time. Each of these actions/motions is done within a set interval or "beat." Each "beat" may vary in length. The sum of all "beats," or "beat period" defines the overall throughput of the tool or module for a given set of conditions. The logic used to define a series of "beats," or "beat frequency" may be applied to systems containing two or more robots.

Figure 2A:
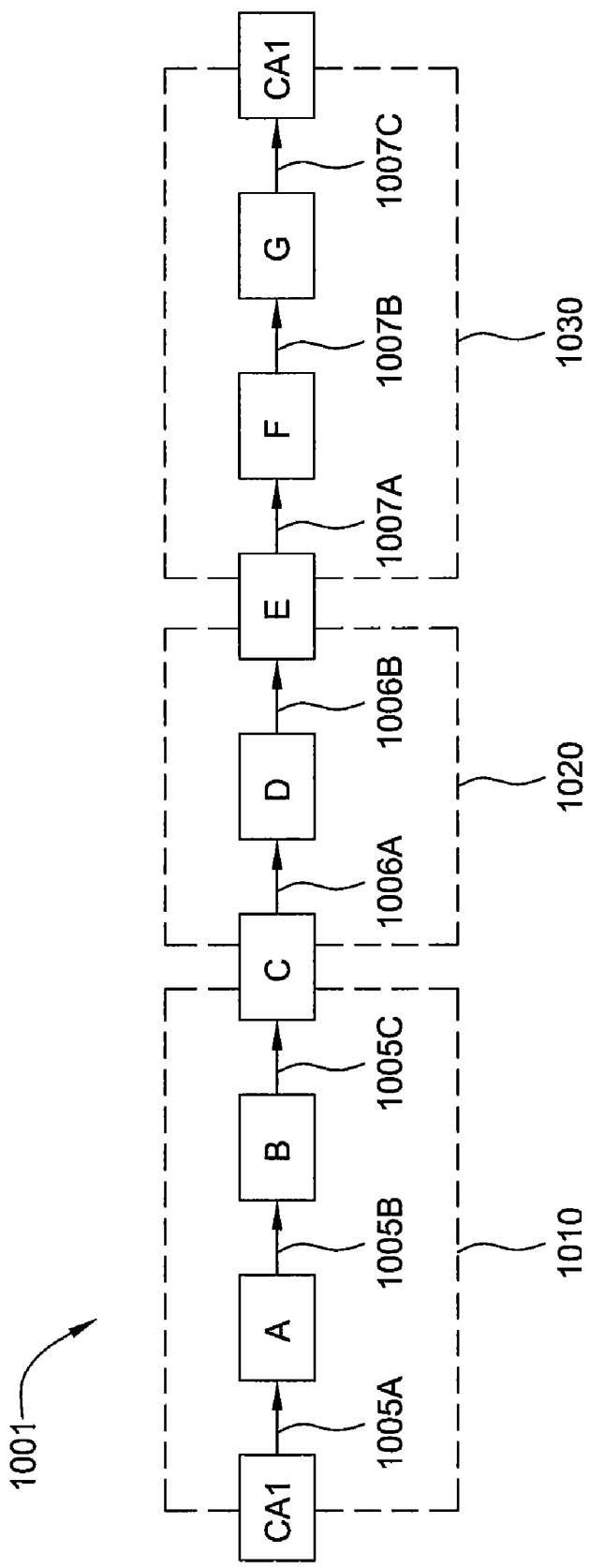
FIG. 2A schematically illustrates an example of a processing sequence according to one embodiment of the invention.

FIG. 2A schematically illustrates an example of a processing sequence 1001 that a plurality of substrates follow during processing in a three robot containing cluster tool. The cluster tool has a first robot that is adapted to service a first group of chambers 1010, a second robot that is adapted to service a second group of chambers 1020 and a third robot that is adapted to service a third group of chambers 1030. The first robot is adapted to service four chambers in the first group of chambers 1010, which include the cassette CA1 and process chambers A-C. The second robot is adapted to service three chambers in the second group of chambers 1020, which include the process chambers C-E. The third robot is adapted to service four chambers in the third group of chambers 1030, which include the process chambers E-G and cassette CA1. As shown in FIG. 2A, each of the robots in the system will overlap at least one point in the system, such as the first robot and the second overlap at chamber C, and the second and third robots overlap at chamber E, thus providing places where the robots can collide or transferring bottlenecks can occur. The configuration of the chambers, the number of chambers in each group and the number of robots in the cluster in this example are not intended to be limiting as to the scope of the invention discussed herein.

To transfer substrates through the system the first robot performs three movement steps 1005A-1005C, the second robot performs two movement steps 1006A-1006B, and the third robot performs three movement steps 1007A-1007C. Each of the movement steps 1005A-1005C, 1006A-1006B, and 1007A-1007C performed by each robot will require two sub-steps in which 1) the robot physically moves from one position to another within the cluster tool, which are referred to hereafter as "moves", and 2) an extension step is performed in which the substrate is positioned by use of a robot blade type of device. Typically, the extension steps only require the robot blade type to be translated to a desired position within the cluster tool (e.g., into a processing chamber, into a buffer station), while the major components (e.g. horizontal assembly 90, vertical assembly 95 in FIG. 1B) in the robot are generally stationary. Extension steps are actions in which the system controller causes the robot blade to extend or retract to cause the wafer to be placed or removed from a desired position within the cluster tool. The wafer placement or removal steps are some times called hereafter a "drop" or a "pick" move, respectively. In some cases it may be desirable to overlap a portion of the move and extension steps to improve substrate throughput, and thus the illustration of completely isolated steps in FIGS. 2A-2E are not intended to be limiting to the scope of the invention described herein.

Figure 2B:
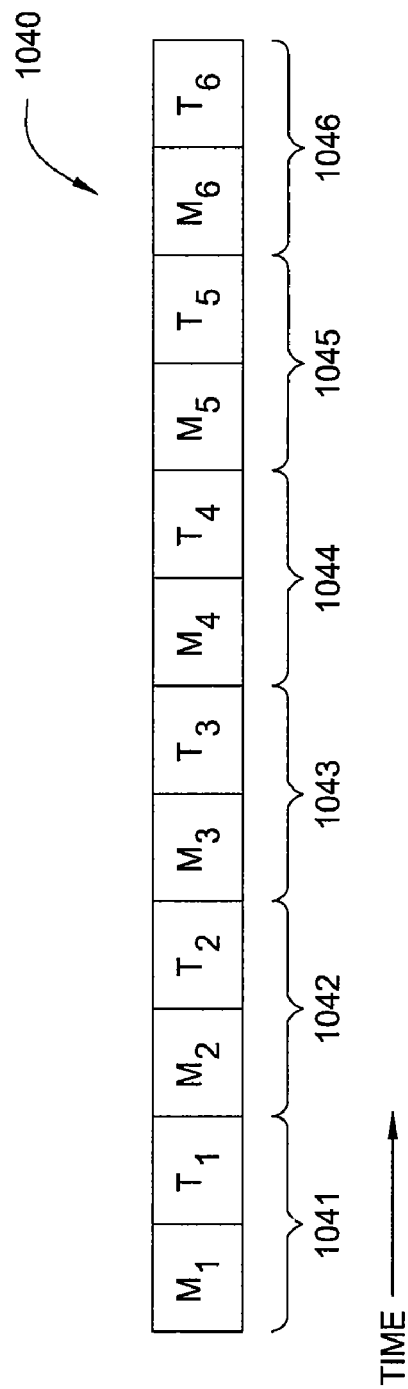
FIG. 2B illustrates a timing diagram according to one embodiment of the invention.

FIG. 2B is a schematic view of a timing diagram 1040 that illustrates a series of actions performed by a robot in which the robot performs a number of moves (e.g., $M_1, M_2, M_3$) that are followed by a number of extension steps (e.g., $T_1, T_2, T_3$). Each of the transfer steps 1041-1046 contain a move (e.g., $M_1$-$M_6$) and an extension step (e.g., $T_1$-$T_6$). In one example, as shown in FIG. 2B each move (e.g., $M_1, M_2, M_3$) has a similar length, and each extension step (e.g., $T_1, T_2, T_3$) has an equivalent length. In most real systems the move times may vary due to the physical spacing that the robot is required to translate during each move, while the extension steps will generally remain fairly constant, since these movements are limited by the need to make sure the wafer does not slide or move on the blade during the translation of the substrate. The timing diagram 1040 is generally intended to illustrate an example of a transferring sequence performed by a single bladed robot assembly, since each of the transfer steps require moves (e.g., $M_1$-$M_6$) that have a similar duration in time.

Figure 2C:
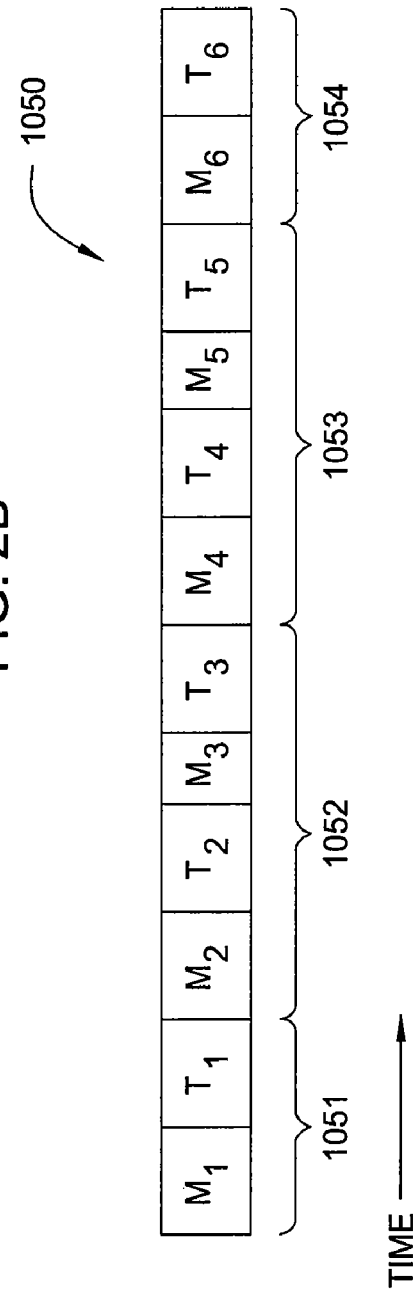
FIG. 2C illustrates a timing diagram according to one embodiment of the invention.

FIG. 2C is a schematic view of a timing diagram 1050 that illustrates a series of transfer steps performed by a robot in which the moves (e.g., $M_1$, $M_2$, $M_3$) have differing lengths and the extension steps (e.g., $T_1$, $T_2$, $T_3$) have a fairly similar duration. This example is similar to a transfer process that may be performed by a dual blade assembly used to swap and transfer wafers from various positions within the cluster tool. In general, a dual blade assembly has two independently controlled robotic arms that are coupled together and remain in a known orientation to each other so that each of the two independently controlled robotic arms can independently position a wafer in two or more know positions in the cluster tool. In one embodiment, during each of the moves (e.g., $M_1$, $M_2$, $M_3$) both of the robot blades are transferred together from one position to another position within the cluster tool. An example of a dual blade robot assembly is further described in the and commonly assigned U.S. patent application Ser. No. 11/315,984, filed Dec. 22, 2005, entitled CARTESIAN ROBOT CLUSTER TOOL ARCHITECTURE, which is incorporated by reference herein.

In one embodiment, as shown in FIG. 2C, during a transfer step 1051 the dual bladed robot performs a move $M_1$ and then a wafer is picked-up from a first extension position within the cluster tool by use of an extension step $T_1$ performed by one of the robot's dual blades. Next the robot performs a swap transfer step 1052 in which the dual bladed robot performs a move $M_2$, a second extension step $T_2$, a short move $M_3$, and then third extension step $T_3$. The second move $M_2$ allows the wafer and the robotic arms to be moved from a first position to a second position so that the robotic arm that the non-wafer containing blade can remove ("pick" step) a wafer positioned in a second extension position during the second extension step $T_2$. The short move $M_3$ is generally shorter than the other moves $M_1$ and $M_2$, since the only action occurring in this step is a short translational movement that allows a robotic arm that contains a wafer to move into alignment with the second extension position from a position that was close to the second extension position, and so that a third extension step $T_3$ can be performed. In this example, the robot then performs a swap transfer step 1053 in which the dual bladed robot performs a move $M_4$ to a fourth position within the cluster tool, a fourth extension step $T_4$ to a third extension position, a short move $M_5$, and then fifth extension step $T_5$ to the third extension position. The actual movement and actions taken in the swap step 1053 are similar to the swap transfer step 1052 discussed above, except for movement between differing positions within the cluster tool and thus are not discussed again here. Next, the wafer remaining on one of the blades after the swap transfer step 1053 is dropped off in a desired position within the cluster tool during a transfer step 1054 in which the dual bladed robot performs a move $M_6$ and then the wafer is dropped off to a fourth extension position within the system by use of an extension step $T_6$. Although the number of steps performed during the timing diagram 1040 (FIG. 2B) and the timing diagram 1050 (FIG. 2C) is the same, the wafer throughput in FIG. 2C is higher due to the reduction in the time required to perform moves $M_3$ and $M_5$.

Figure 2D:
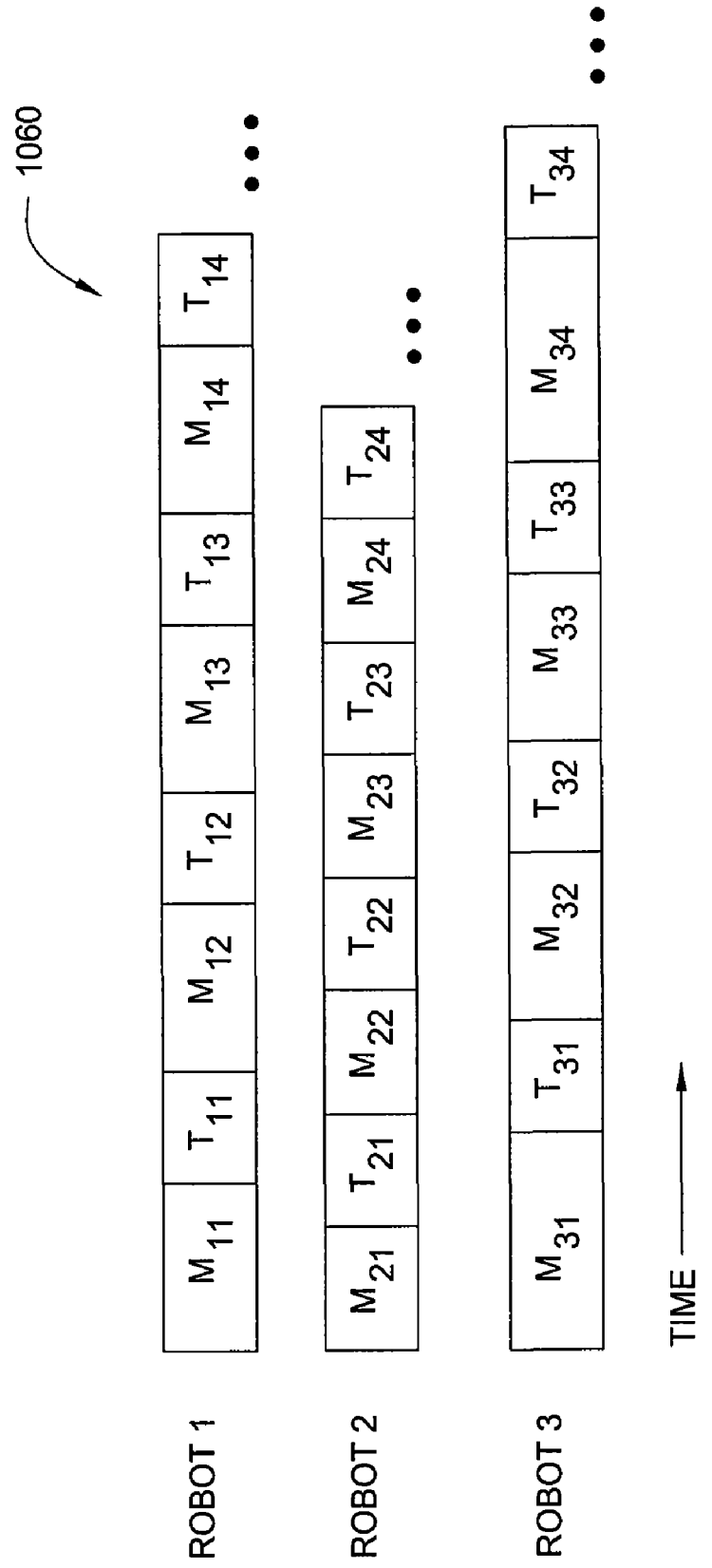
FIG. 2D illustrates a series of timing diagrams according to one embodiment of the invention.

FIG. 2D illustrates a timing diagram 1060 that illustrates a series of transfer steps performed by three robots in which the first robot completes moves (e.g., $M_{11}$, $M_{12}$, $M_{13}$, $M_{14}$) and extension steps (e.g., $T_{11}$, $T_{12}$, $T_{13}$, $T_{14}$), the second robot completes moves (e.g., $M_{21}$, $M_{22}$, $M_{23}$, $M_{24}$) and extension steps (e.g., $T_{21}$, $T_{22}$, $T_{23}$), and the third robot completes moves (e.g., $M_{31}$, $M_{32}$, $M_{33}$, $M_{34}$) and extension steps (e.g., $T_{31}$, $T_{32}$, $T_{33}$, $T_{34}$) that each may have differing lengths in time. As shown in FIG. 2D, the relationship of each of the robots to each other may vary at any instant in time and thus the rules or timing between processes may vary, thus causing the system controller to make decisions on-the-fly.

Figure 2E:
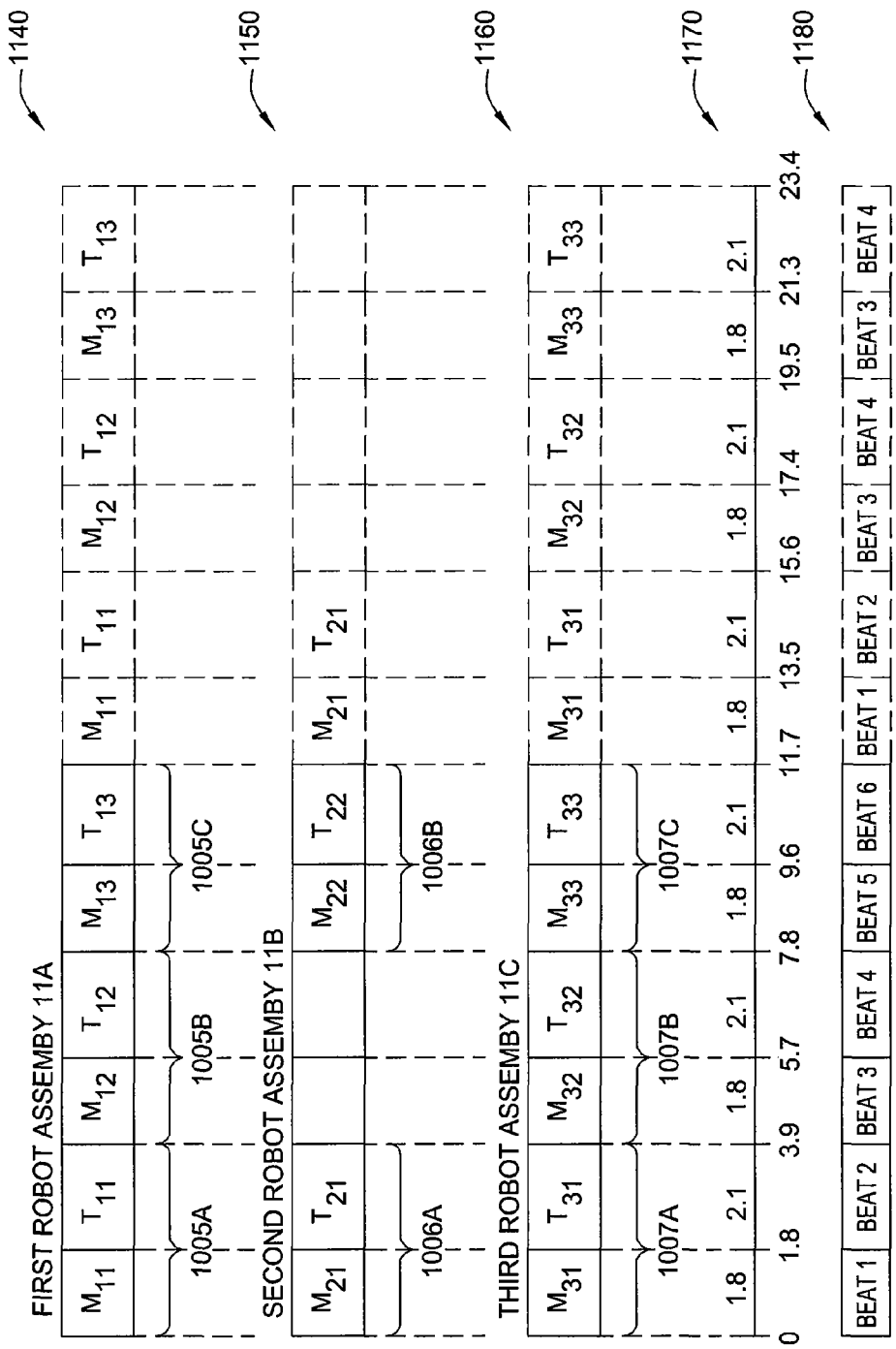
FIG. 2E illustrates a series of timing diagrams according to one embodiment of the invention.

FIG. 2E illustrates a series of timing diagrams 1140, 1150 and 1160 for each of the three robots (e.g., first robot assembly 11A, second robot assembly 11B, third robot assembly 11C in FIG. 1B) used to perform the processing sequence 1001 discussed in FIG. 2A, and is used herein to describe the various aspects of beat frequency type of control. The timing diagram 1180 illustrates the timing of each beat that correlates to the move and transfers steps illustrated in the timing diagrams 1140, 1150 and 1160. The time line 1170 represents the duration of each of the beats in the timing diagram 1180 and their relation to real time.

In this configuration, the length of time required to complete each simultaneously performed move and/or extension step will occur during the same length of time. In general, this means that each move and/or extension step will start at about the same time and end at different times, but the robots that perform the shorter duration steps will remain idle for a period of time until the longest step performed by a robot is completed. For example, during the first beat, or Beat 1, all three robots perform their respective moves (i.e., $M_{11}$, $M_{21}$ and $M_{31}$) during the first portion of the movement steps 1005A, 1006A and 1007A, respectively. In this example, the first robot performs a move $M_{11}$ that takes 1.8 seconds, the second robot performs a move $M_{21}$ that takes 1.5 seconds, and the third robot performs a move $M_{31}$ that takes 1.7 seconds. Thus the length of Beat 1 is 1.8 seconds, and the next part of the movement steps 1005A, 1006A and 1007A are not started until the first robot has finished its move $M_{11}$ and the Beat 1 has ended. Next, in this example, the first robot performs an extension step $T_{11}$ that takes 2.0 seconds, the second robot performs an extension step $T_{21}$ that takes 1.9 seconds and the third robot performs an extension step $T_{31}$ that takes 2.1 seconds. Thus the length of Beat 2 is 2.1 seconds, and the movement steps 1005B and 1007B are not started until the third robot has finished its extension step $T_{31}$ and the Beat 2 has ended. The beats and sub-beats for all of the subsequent steps are similarly performed in the processing sequence so that each of the simultaneous performed steps are performed within a defined beat and the length of the beat is set by the length of the longest step. The total time to execute these 6 beats is thus approximately 11.7 seconds. As illustrated in FIG. 2E, in some cases an under-utilized robot, such as the second robot (second robot assembly 11B) robot may remain idle for one or more of the beats to help prevent collisions between robots.

In one aspect, it may be desirable to adjust the phase of the movement steps, or sub-steps, to prevent the collisions that can occur when two or more robots are required to pick or place a wafer in the same chamber, or at a different chamber positioned in the same vertical rack, during the same beat. In one embodiment, it may be required to continually alter the phase of the movement steps to prevent collisions from occurring at multiples of the beats, such as first robot and second robot will move into phase every sixth beat. In another embodiment, it may be necessary to adjust the phasing of the beats by shifting the collision prone cyclic occurring beats so that they are out of phase, and then adding one or more idle periods into a robots' transferring sequence to assure that each robot has the same number of beats in the cycle, or the various robots have a number of beats that are multiples of each other in the repeating cycle, so that the phase relationship never varies with time.

In one embodiment, it may be desirable for one or more robots in a cluster tool to perform one or more "ghost moves" during a beat within a processing sequence to assure that the physical relationship of the robots to each other remains consistent during each part of the processing sequence. A "ghost move" refers to a movement of the robot in which the robot goes through the motion of transferring a wafer that is not present on the robot blade or in the processing chamber. The "ghost move" is thus used to maintain a similar relationship of two or more robots to each other to help make the wafer history more repeatable.

While not illustrated in FIGS. 2A-2E for complexity reasons, the optimum beat frequency will generally also take into account the variations in processing times of each of the process chambers (e.g., chambers A-G in FIG. 2A) in the processing sequence 1001 to assure that wafers are not left idle for varying amounts of time during the process sequence. Thus, in one embodiment, it is desirable to alter the length of one or more of the beats to assure that the timing to pickup and/or drop-off a substrate is more repeatable. It is believed that during amplified resist photolithography type processes this analysis can be important since it is not desirable to allow wafers exiting a stepper (e.g., external module 5 in FIGS. 1A-1E) to wait a variable amount of time due to the typical generation of PAGs that will affect CD of the processed substrate.

In another embodiment, it is desirable to strategically add one or more buffer stations within a cluster tool to account for systematic variations in substrate throughput caused by the cyclic nature of the transfer sequences and the shifting bottlenecks in the system due to system faults or other typical unknown causes of throughput variability. The buffer stations generally contain a plurality of wafer holding positions (e.g., support chambers 165) that may be accessible by one or more of the robots and allow substrates to collect so that the timing between critical steps can be maintained. In general the buffer positions will be placed in positions where waiting a variable amount of time will not affect the process results by varying the wafer history of each wafer, such as after a cool down step during photolithography processing. An example of various exemplary buffer stations that may be used in conjunction with the embodiments described herein are further described in the in the and commonly assigned U.S. patent application Ser. No. 11/315,984, filed Dec. 22, 2005, entitled CARTESIAN ROBOT CLUSTER TOOL ARCHITECTURE, which is incorporated by reference herein.

EXAMPLE

FIGS. 3A-3B are robot move tables for the first robot assembly 11A, the second robot assembly 11B, and the third robot assembly 11C, respectively. FIG. 3A is an example of actual data collected for a robotic system, or hereafter a master move table 1300, for a three robot system representing a desirable process flow that has a maximum robot limited throughput. The data represented in the "zone" columns of the tables shown in FIGS. 3A and 3B relate to FIG. 7, which is a schematic plan view of a simplified version 1700 of the cluster tool 10 of FIG. 1 showing different chamber zones 1705, 1710, 1715, 1720, 1725, and 1730 in which the robots 11A, 11B and 11C may move. In this example, the chamber zones 1705, 1710, 1715, 1720, 1725, and 1730 are adjacent to the various processing chambers found in the first processing rack 60 and second processing rack 80. In general, all three robots 11A, 11B, and 11C move to different chamber positions within different chamber zones at the same time and will also initiate transfer moves (pick/drop) at the same time, this is referred to as the "beat frequency," which is described above. A more complete discussion of a master move table is discussed below in conjunction with FIG. 6.

FIGS. 3A-3B are robot move tables that represent groups of moves (M) and extension steps (i.e., D/P (or Drop/Pick) in the "Move Type" column) that are sequentially performed by the robots 11A, 11B and 11C. Each row illustrates transferring process step(s) taken by each of the robots during each beat that lasted a defined time shown in the "time" column. The moves performed during the transferring process have been characterized as a long (L), short move (S), or zero (0) which occurs in the case of a swap. The zone location of the destination of each robot move is identified in the "zone" column. If the process chamber could be in more than one zone (e.g. a develop bowl in zone 1X or 2X, then 1X/2X is entered in the master move table. It should be noted that PR stands for photoresist process chambers, PTi stands for pass through input chambers (e.g., pass through position 9A, 9B or 9C), PTp stands for a pass through chambers positioned near the rear robot assembly 40 (e.g. one or more support chambers 165), BARC is a bottom anti-reflective coating process chambers, PR B/C stands for photoresist process bake and chill chambers, BARC B/C are bottom anti-reflective coating bake and chill process chambers, PEB/C are PEB bake and chill chambers, and DEV are photoresist develop chambers. In this example the Exposure process step (e.g., step 514 in FIG. 1F) is replaced with a drop at the pass through (Drop PTp) for the rear robot assembly 40.

In FIG. 3A, the phasing of the second robot assembly 11B is set up in a manner to enhance the limited throughput of the system. For this example, all of the single blade moves are scheduled to occur during the same "beat" within move #1 for each robot. This creates a total robot cycle time of 19.0 seconds which is equal to 189 WPH. For a 45 second process time, the effective throughput of the first chamber is equal to (3*3600)/64.8 or 167 WPH.

FIG. 3B is another master move table 1310 for a three robot system representing BARC process flow with maximum robot limited throughput. The phasing of the second robot assembly 11B is changed to reduce the swap time at the PR bowl to 6 seconds. In this case, the throughput limit for the PR bowls is equal to (3*3600)/51 or 212 WPH. Therefore, changing the phasing does have an impact on the robot limited throughput. The total robot cycle time is 21.6 seconds which is equal to 167 WPH.

Both schedules, FIG. 3A and FIG. 3B, produce the same system throughput of 167 WPH. However, if the bowl process is reduced from 45 seconds to 40 seconds then the bowl capacity is increased to 180 WPH and it is preferable to operate in the mode that provides the maximum robot limited throughput, which is the schedule in FIG. 3A. In this case, the throughput would again be limited by the chamber at (3*3600)/59.8 or 180 WPH which is preferable to the robot limited throughput case of 167 WPH in FIG. 3B.

If the process time is increased to 50 seconds, then operating in the long swap condition would reduce the throughput below 167 WPH resulting in a throughput of (3*3600)/69.8 or 154 WPH. In this case it is best to operate in the mode that provides the maximum chamber throughput (including swap time). In this case, the throughput would be limited to 167 WPH.

FIGS. 3A and 3B demonstrate the importance of establishing what the bottleneck resource is so the bottleneck can be properly managed. Proper management of the bottleneck resources helps avoid situations where small changes in recipe times lead to confusing throughput results.

Offline Application

Factories often use different methods and/or software to plan and schedule batches of substrates through the factory. These are often referred to as schedulers or dispatchers. These solutions generally implement a dispatch logic in which predetermined rules are used to define what action should be performed next by the equipment or the factory.

The offline application provides optimal time-based chamber process recipes and/or process sequences without tying up the cluster tool. The offline application generally allows the user to model, analyze, and control the process variables within a process sequence in an unobtrusive manner to allow the throughput and/or process results received in one or more batches of wafers to be optimized. In one embodiment, a time-based sequencer is put on an off-line server to develop optimum process recipes and process sequences. The offline application can be used for recipe development and can display both a standard recipe and one or more modified recipes for comparison. The offline application can perform the following: download schedules from the cluster tool, up-load recipes and sequences to the cluster tool, and execute schedules. The offline application allows for modeling tool output (throughput of the tool) given the optimum processing requirements set by the user. The offline application allows automatic tact-time (wait time) calculations at each process step to allow for optimization of the processing recipe and process sequence recipe. The offline application allows the user to minimize the effect of planned delays and automatically resolves robot conflict to provide the highest robot-limited throughput. The offline application allows the user to schedule planned delays, such as maintenance activities. The offline application allows the user to decide when to start a trailing lot in a cascading mode (multiple lots run in series). The offline application allows the user to define desired process and system constraints when running a desired chamber process recipe or process sequence. The offline application allows the user to select schedules from proposed/modeled candidate schedules created by the controller. The offline application facilitates the selection of the optimal track system to use in the fab. The offline application modeling allows the user to decide if cascaded lots can be inter-woven. The offline application allows the user to schedule maintenance (e.g. bowl wash, calibration) based on when the module is scheduled to be idle. The offline application also allows the user to model "What if" scenarios (an exception occurs), and the possible/optimal recovery moves.

Another feature of the offline sequencer is that the logic and analysis components required to set up and run a process sequence on multiple cluster tools can be made offline in a single system that is in communication with multiple "dumb" cluster tool controllers (e.g., no adaptive sequence type control), which just execute the sequence commands sent by the offline sequencer. Since the offline controller contains most of the logic components of the system this configuration can greatly decrease the cost of ownership and complexity of each of the multiple cluster tools.

Figure 4:
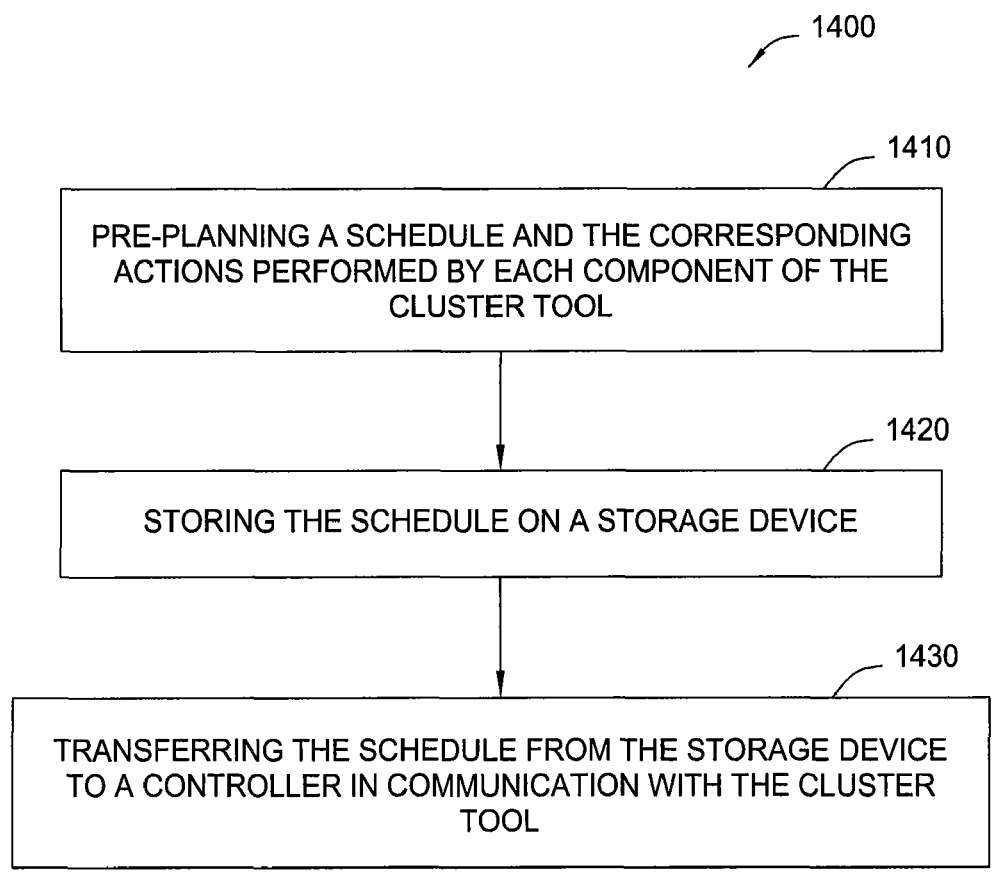
FIG. 4 is a process flow diagram describing an offline method used to create a schedule for a track system in accordance with one embodiment of the present invention.

FIG. 4 is a process flow diagram 1400 describing a method of using an offline application to create a schedule for a track system. At step 1410, the method begins by pre-planning a schedule and the corresponding actions performed by each component of the cluster tool 10. In step 1420, the schedule is stored on a storage device 604. In step 1430, the schedule is transferred from the storage device 604 to a controller 101 in communication with the cluster tool 10 where the schedule is stored.

Figure 5:
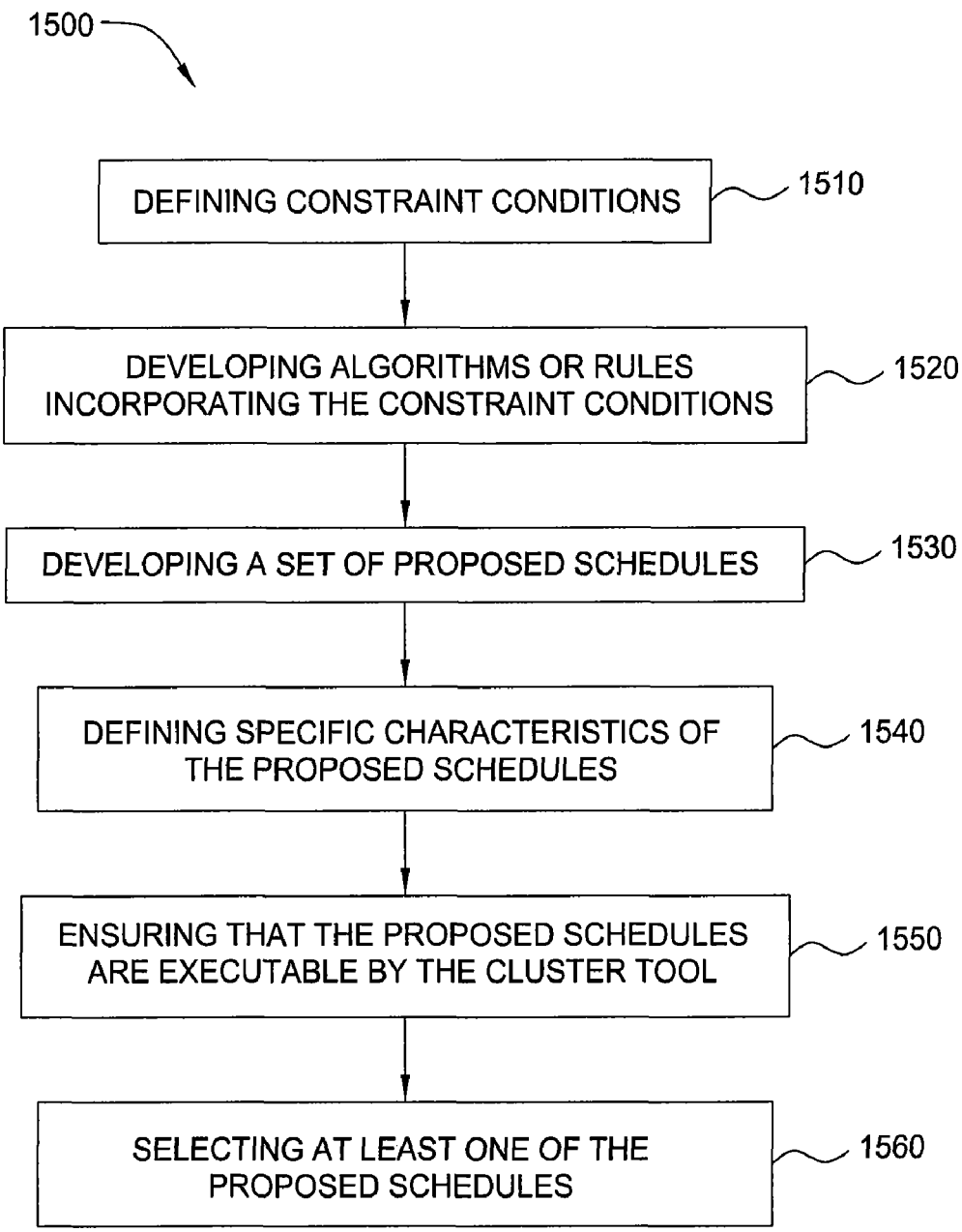
FIG. 5 is a process flow diagram describing the pre-planning method used to create a schedule for a track system in accordance with one embodiment of the present invention.

FIG. 5 is a process flow diagram 1500 describing the pre-planning method of step 1410 used to create a schedule for a track system. In one embodiment, the method may take the form of a question and answer interface that guides the user through the development of an optimal processing recipe and process sequence recipe. In step 1510, constraint conditions are defined by the user or system. Typical constraint conditions include, for example, those noted previously such as restricting use of a particular robot blade for a particular step, optimization for swap time for a process or for the maximum throughput, and optimization for constant wafer history or throughput.

In step 1520, rules incorporating the constraint conditions are developed. Typical rules may include anomaly condition rules such as maximizing system level throughput if one chamber is down or retaining wafer history if one chamber is down. For example, if a system has a chamber type, referred to as "chamber type A," with 3 chambers and a process time including wafer swap time of 90 seconds, the chamber type A bottleneck throughput is 120 wafers per hour. If the same system has a chamber type, referred to as "chamber type B," with 3 chambers and a process time including wafer swap time of 70 seconds the chamber type B bottleneck throughput is 154 wafers per hour. If one of the type B chambers fails, the system could continue to process wafers at a rate of 103 wafers per hour (⅔*154). However, the wafer history will change. Since the system initially has the same number of type A and type B chambers, the system could be re-configured to have one of the type A chambers disabled from operation so the system would run at a rate of 80 wafers per hour (⅔*120) with a wafer history similar to the original setup. If the system did not have the same number of type A and type B chambers, then removing one type A chamber would not rebalance the system. The system could also be configured to maintain all three type A chambers as operational with the two type B chambers, using the original beat frequency and schedule but invoking a ghost move on every third wafer removed from the cassette or wafer carrier. This ghost move would move a "phantom" wafer though the system, a wafer that is scheduled to be delivered at some point to the failed chamber B. This configuration would yield a throughput of 80 wafers per hour with the original wafer history. Normally, different rules are configured on tools as part of the system setup and apply to a recipe or are defined by the recipe. The offline application allows for all rules to be defined as part of the product recipe and modeled so the tool behaves exactly as intended by the engineering. Without this, specific tool behavior, especially during anomaly conditions, may not be optimized. The rules are used to control the various components in the system to meet the defined constraint conditions.

In step 1530, a set of proposed schedules is developed. In step 1540, specific characteristics of each schedule are defined by analysis performed by the system controller. In step 1550, the system controller uses computer modeling to review and ensure that the proposed schedules are executable by the cluster tool 10. The computer model contains real data, software, and all other aspects that will allow the evaluation of tool performance based on the defined constraints and the applicable rules. The computer model provides a process of developing the rules to meet a desired goal by simulating how the tool will perform based on different scenarios. The controller, through use of a software algorithm stored in memory is able to calculate the timing and movement of substrates through the system based on the rules, constraints, and actual input data. The specific characteristics allow the user to weigh the various benefits of selecting or prioritizing rules and/or constraint conditions in a desired order. In step 1560, one of the proposed schedules may be selected by the user and then uploaded to the cluster tool.

EXAMPLE

Figure 6:
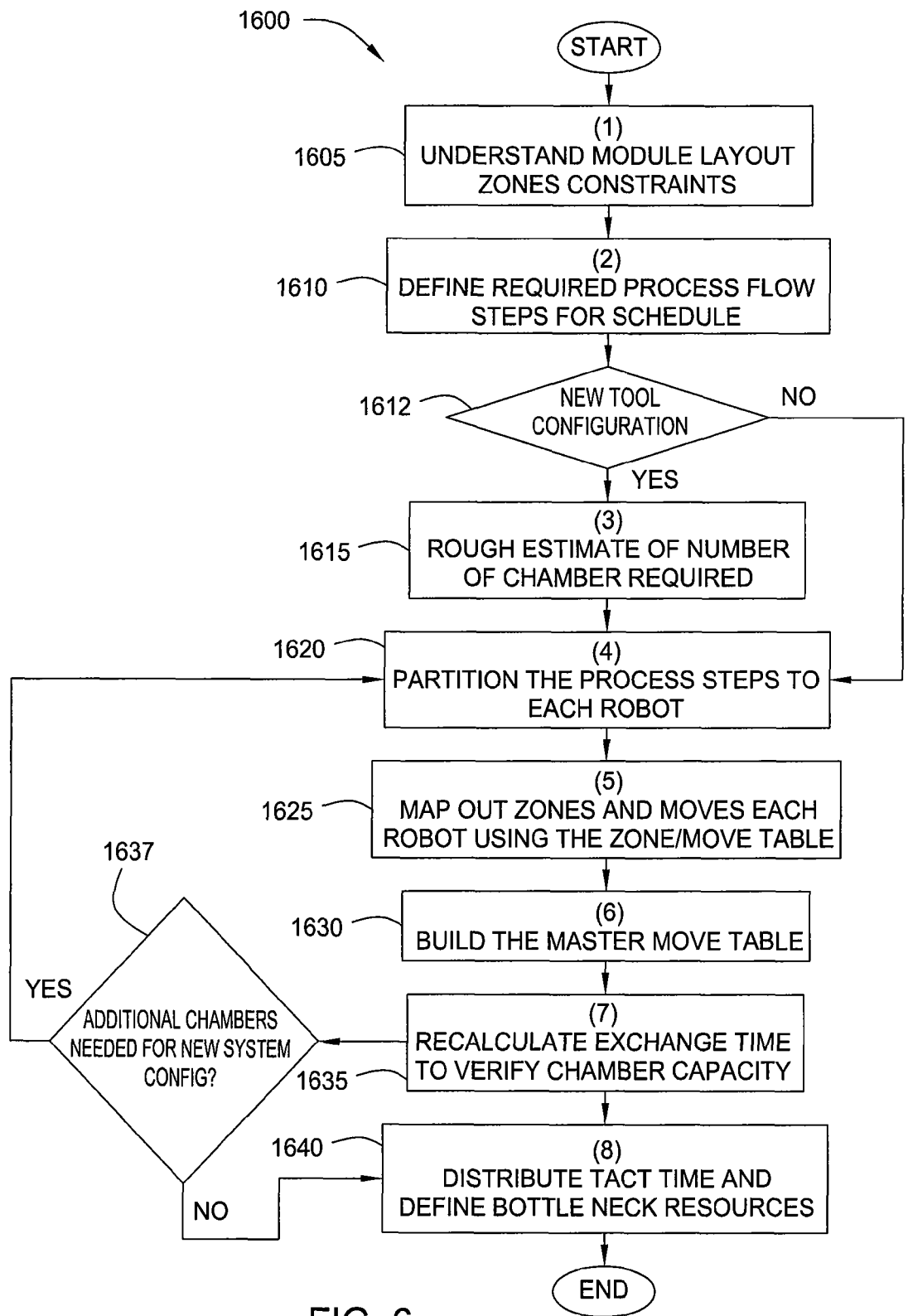
FIG. 6 is a process flow diagram describing the method used to create a schedule for a track system in accordance with one embodiment of the present invention.
Figure 7:
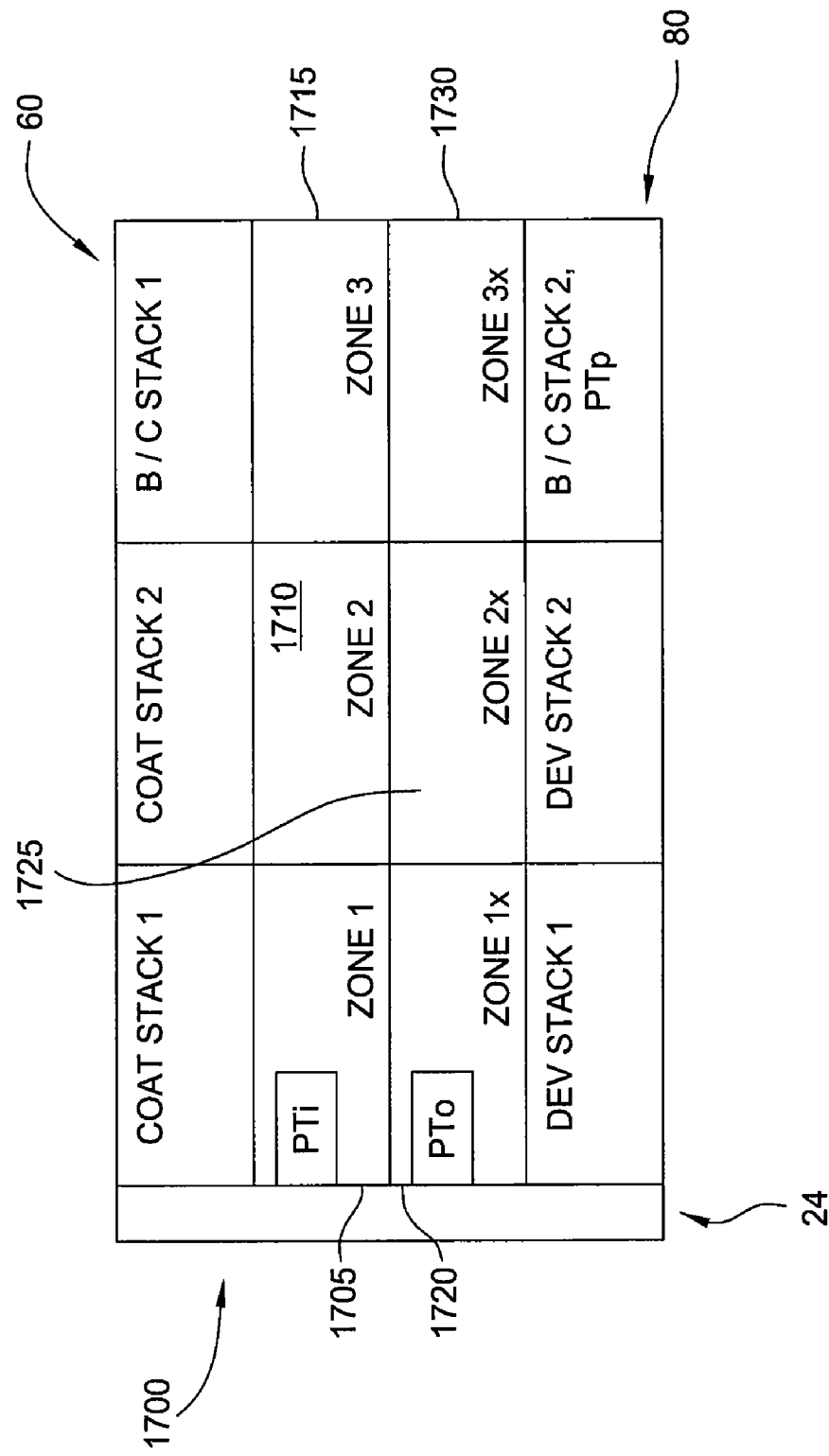
FIG. 7 is a simplified version of the cluster tool of FIG. 1 illustrating different chamber zones in accordance with one embodiment of the present invention.

Examples of the above introduced offline application are further described with reference to FIGS. 6-9. FIG. 6 illustrates an exemplary process flow diagram 1600 describing an example of the rules referred to in step 1520, used to, through software stored in the memory of a controller and some user input, create a schedule for a track system. Although the current example refers to cluster tool 10 with a three robot configuration, it should be noted that the three robot configuration is used only for illustrative purposes, and the offline application and rules can be used to develop schedules for other chambers, for example, chambers containing one, two, or four robot configurations.

In step 1605, the process begins by examining and inputting the process chamber layout, robot access zones and other system constraints into the offline application software. The input data may be in the form of 3-dimensional positional data of process chamber information (e.g., entrance information), robot movement, and motion control information (e.g., velocity position limitations, etc.). Next, in step 1610 the required process flow steps for the schedule are entered into the offline application software. Next, in step 1612, a decision is made as to whether the cluster tool configuration has the necessary hardware to meet the requirements defined by the constraints and the rules. If the necessary hardware is not present, the user will be alerted so that another process sequence can be selected so that the new tool configuration can be optimally used. If a new tool configuration is applied, in step 1615, an estimate of the number of chambers required to perform the desired process sequence for the new tool configuration is made. If a new tool configuration is not applied, step 1615 is skipped. Next, in step 1620, the process steps are partitioned to the various cluster tool robots and the candidate transition points are defined. Next, in step 1625, zones (regions) within the cluster tool and the moves which each robot will optimally make when the process sequence is performed are mapped for each robot using a Zone/Move table. Next, in step 1630, tables containing all of the moves that each robot will perform are collected and placed in a master move table. Next, in step 1635 the exchange time is recalculated to verify chamber capacity. If additional chamber capacity is required, additional chambers are added to the system in step 1637 and steps 1620, 1625, 1630, and 1635 may then be repeated. Next, in step 1640, TACT time is distributed and bottle neck resources are defined.

In step 1605, the module layout, zones, and constraints are examined. The following constraints are place on the architecture of cluster tool 10 in this illustrative example. Cluster tool 10 is architected to provide a solution that meets product and processing requirements while also providing a solution that enables robust scheduling. In one example, cluster tool 10 is designed with a first processing rack 60 and a second processing rack 80. The first processing rack 60 and the second processing rack 80 contain one or more groups of vertically stacked processing chambers. These processing chambers are defined as follows: a coat bowl tower, a develop bowl tower, a thermal stack tower, a front end module 24, an external module 5 (e.g. stepper or scanner), and a central module 25. The central module contains a robot that moves wafers to a stepper interface robot and loads PEB chambers. The external module 5 contains a robot 40 that moves wafers from the OEBR or stepper and back to the buffer. The front end module 24 contains a front end robot assembly 15 that moves wafers from the output pass through back to the pod assemblies 105.

For this illustrative example, the cluster tool 10 is designed as follows. The process chambers are designed with a size that ensures that the robots have adequate clearance from adjacent modules to reduce or eliminate collision avoidance. Only coat bowls will be located in the first processing rack 60 of the cluster tool 10. Only developer bowls will be located in the second processing rack 80 of the cluster tool 10. Coat bowl and developer bowls are not mixed. For this illustrative example, enforcing this constraint ensures that wafers start the process flow on the left side of the cluster tool 10 (adjacent first processing rack 60) and once the wafer leaves the left side of the cluster tool 10, the wafer does not need to return to that side. This architectural decision creates a "quasi-parallel" flow that simplifies the scheduling and architecture with little or no negative impact. For the three robot system, the robots are named as follows: the first robot assembly 11A (left), the second robot assembly 11B (middle), and the third robot assembly 11C (right). Pass through positions 9A-9B, accessible by the first robot assembly 11A and the second robot 11B are installed at the input of the cluster tool 10. Pass through positions 9B-9C, accessed by second robot 11B and third robot 11C, are installed at the output of the cluster tool 10.

As noted above, FIG. 7 is a schematic plan view of a simplified version 1700 of the cluster tool 10 of FIG. 1 showing different chamber zones 1705, 1710, 1715, 1720, 1725, and 1730. These chamber zones are defined to simplify scheduling and eliminate collisions. Chamber zone 1 (1705) represents the first coat bowl stack and also includes pass through position 9A in first processing rack 60. Chamber zone 2 (1710) represents the second coat bowl stack in the first processing rack 60. Chamber zone 3 (1715) represents the thermal stacks in the first processing rack 60. In another embodiment multiple zones are used to define the thermal stacks in the first processing rack 60. Chamber zone 1X (1720) represents the first develop bowl stack in the second processing rack 80 and includes pass through position 9C. Chamber zone 2X (1725) represents the second develop bowl stack in the second processing rack 80. Chamber zone 3X (1730) represents the thermal stacks in the second processing rack 80. In another embodiment multiple zones are used to define the thermal stacks in the second processing rack 80. In general, when one of the first robot assembly 11A, the second robot assembly 11B, or the third robot assembly 11C is accessing a chamber zone, the other two robots are locked out from moving in the same zone. In general, all three robots move to different chamber positions within different chamber zones at the same time and will also initiate transfer moves (pick/drop) at the same time, this is referred to as the "beat frequency," which is described above. In some cases, wafer throughput can be increased by allowing the first robot assembly 11A to complete a single blade move/pick or move/drop while second robot assembly 11B and third robot assembly 11C are scheduled to complete a swap move on the right side of the cluster tool 10. Similarly, the third robot assembly 11C could freely move in a chamber zone if the first robot assembly 11A and the second robot assembly 11B are accessing the right side of the cluster tool 10.

Although not addressed in this illustrative embodiment, in another embodiment, it is possible for two robots of the cluster tool 10 to access the same zone at different heights, however, because of potential collisions at some locations, certain move sequences are prevented.

In step 1610, the required process flow steps for the schedule are defined. The process flow steps are determined by the process engineer and the needs of the customer. First, the basic flow process must be converted into a process flow that matches the specified cluster tool architecture. This involves the following steps for this illustrative example which could be modified as the cluster tool architecture changes. The purpose of this step 1610 is to extract only the steps that impact the process unit and the scheduling of the robots.

Other steps, namely those covered by the front end robot assembly 15, the rear robot assembly 40, and the stepper interface robots (not shown) are not included in this exemplary schedule. The exemplary baseline process flow used for this analysis involves Basic Organic BARC. The initial sequence recipe includes the following steps: BARC-BARC B/C-PR-PAB/C-Exposure-PEB/C-Dev.

The Basic Organic BARC process flow is modified for the specific cluster tool 10. First, pass through steps are added at the front end module 24 for pass through input (PTi) and for the pass through output (PTo). The Exposure step is replaced with a drop at the pass through (Drop PTp) for the rear robot assembly 40. The PEB/C step is replaced with a Pick from the PEB module defined as Pick PEB/C which is the standard flow for PEB. The modified process flow for Basic Organic BARC is as follows: PTi-BARC-BARC B/C-PR-PAB/C-Drop PTp-Pick PEB/C-Dev-PTo.

In step 1615, an estimate of the number of chambers required for the modified process is made. This is a first approximation using the defined process times and the estimated chamber exchange times. The number of chambers required is calculated as follows:

$$\text{Chambers} = (\text{Stepper Throughput} \times (\text{Chamber Process Time} + \text{Exchange Time}))/3600$$

Stepper Throughput=Wafers/Hour (or desired throughput of the system)

Chamber Process Time=Process time in seconds

Exchange Time=exchange time in seconds

Chamber exchange times may be determined as follows. For chambers designed for swapping (Coat, Develop, and Swapping B/C/C), the robot swap time is used. A "swap" equals pick time plus drop time. For chambers designed for single blade Pick/Drop (Pass through chambers, Single Blade B/C/C) the single blade time is used. Thus, for single blade Pick/Drop chambers, the exchange time equals pick time plus move time plus drop time plus move time plus pick time plus move time plus drop time. A Long Move (ML) is defined as the longest move time (bottom left to top right within the tool), in this case the ML takes approximately 1.8 seconds. In one example, the time it takes a robot to move between chambers may vary from about 1.0 seconds to about 1.8 seconds. A swap process where a robot picks up and drops a substrate, "quasi-swap", may be about 2.1 seconds each. A short move (MS) is defined as a short move in the same process module stack, in this case for a "quasi-swap" of the single blade B/C/C module takes approximately 1.0 seconds. A "quasi swap" involves a pick/drop followed by a short move followed by a drop/pick. A Pick (P) takes about 2.1 seconds and a Drop (D) takes about 2.1 seconds.

The concept for the current chamber architecture of cluster tool 10 assumes that the first robot assembly 11A, the second robot assembly 11B and the third robot assembly 11C are all in motion at the same time between chamber positions and Pick/Drop transfer steps are completed at the same time without movement of the major robot components (e.g. horizontal assembly 90, vertical assembly 95). As a result, the worst case move time is used for defining the schedule. In one embodiment, the opportunity exists to shorten the joint move time if all robots are scheduled for a shorter move. However, for this illustrative example, only the worst case move is considered for the long move and the 1.0 second move time for the short move within the same stack.

In step 1620, the process steps are partitioned to a robot and the candidate transition points are defined. The current robot architecture of cluster tool 10 is designed to share the load during the sequential processing of the substrates as equally as possible among the process robots. At least two of the process robots can reach each chamber position and as a result, the processing steps assigned to each robot can be modified in order to balance the load. In all cases, the process flow is distributed to the robots with the first robot assembly 11A processing the initial steps, the second robot assembly 11B processing the middle steps, and the third robot assembly 11C processing the final steps of the process. This assignment ensures that once a robot has completed its work with a given wafer, the wafer never unnecessarily returns to that robot, which can waste time and hurt throughput. This eliminates the complexities associated with re-entrant flows of wafers to the same robot. The steps used to partition the flow are defined below.

Balancing involves optimizing throughput by distributing the load among the robots. Balancing of the robot load is divided into three categories. First, for "balanced flows," for example, 3, 6, 9, 12 . . . steps, the moves are distributed evenly to each of the three robots. For "unbalanced heavy flows," for example, 5, 8, 11, 14 . . . steps, the outside robots, first robot assembly 11A and third robot assembly 11C perform the same number of moves and the second robot assembly 11B is loaded with one less move. Since the second robot assembly 11B can access both sides, it is best to only maximize the loading on this "flexible" resource when absolutely necessary. For "unbalanced light flows, for example, 4, 7, 10, . . . steps, moves for the second robot assembly 11B and the third robot assembly 11C are balanced and the first robot assembly 11A performs one additional move.

After the robot loads are balanced, the transition points for each robot are defined using the following criteria. The input and output transition moves for each robot sequence is a single blade move. The input is a single blade Move/Pick the output or last step is a single blade Move/Drop. While partitioning the process moves, these can be considered as half moves. For a single blade B/C/C performing this exemplary recipe the robots act as follows: the first robot assembly 11A: Pick PTi-swap BARC-Drop/Pick BARC B/C-Drop PR. For the second robot assembly 11B the steps are as follows: Pick PR-Pick/Drop PAB/C-Drop PTp. For the third robot assembly 11C the steps are as follows: Pick PEB/C-swap Dev-Drop PTo. For a swappable B/C/C performing the exemplary recipe the robots act as follows: for the first robot assembly 11A the steps are as follows: Pick PTi-swap BARC-swap BARC B/C-Drop PR. For the second robot 11B the steps are as follows: Pick PR-swap PAB/C-Drop PTp. For the third robot assembly 11C the steps are as follows: Pick PEB/C-swap Dev-Drop PTo.

Figure 8A:

In step 1625, zones and moves are mapped for each robot using a Zone/Move table. FIGS. 8A-8C are robot move tables for the first robot assembly 11A, the second robot assembly 11B, and the third robot assembly 11C respectively. With reference to FIG. 8A, the move table 1810 for the first robot assembly 11A is created as follows. First, the start moves are completed. The first step is always a PTi for both the Move (M) and the Pick (P). The chamber position Move (M) is identified as Long (L) or Short (S). The robot zone location for each move is also identified. If the chamber could be in more than one zone (e.g. a develop bowl in zone 1X or 2X, then 1X/2X is entered. Next, the first step is completed. The current example is for a single blade BARC flow with single blade B/C/C. For the chamber position moves (M) identify if the move is long (L), short (S) or zero (0) in the case of a swap. The sequence for a swap is Move/Pick/Drop and the line for the second chamber move (M) in the table is left blank and no step name would be placed in the position. Next, the middle moves are completed. In this example, the middle moves include a move to the single blade B/C/C. After the middle moves are complete, the last half move is the drop at the transition chamber, which in this case is the PR (photoresist or coater) chamber. The same process was completed to develop the move table 1820 for the second robot assembly 11B, FIG. 8B, and the move table 1830 for the third robot assembly 11C, FIG. 8C In step 1630, a master move table is built. FIG. 9 illustrates a master move table for the three robot system of the cluster tool 10. The master move table is similar to the robot table, however, the start and end moves for the first robot assembly 11A (Move PTi/Pick PTi and Move PR/Pick PR) are "wrapped" together to combine these two half moves into one single substrate move sequence at the top of the master move table. In this step of the process, the individual robot moves are placed into a common schedule table. Rules are applied to adjust the phasing of the robots to avoid zone conflicts and to group moves to optimize the flow. "Phasing" involves aligning the moves of each robot. For example, all three robots perform a pick/drop or drop/pick during the same "beat" or all three robots move to different chamber zones during the same "beat." Grouping the moves and adjusting the phasing provides opportunities to reduce the time for a complete robot cycle time from the maximum time (all single blade moves) by completing "quasi swap" or "swap" moves at the same time across all the robots.

In step 1635 the exchange time is recalculated to verify chamber capacity. The exchange times for each chamber are recalculated to determine whether the exchange time is different from the estimated exchange times from step 1615. This can be done directly from the master move table of FIG. 9, assuming that the system is operating at robot limited throughput. If the exchange times are different, then the number of chambers required is updated in step 1637. A difference in exchange times could be caused if the phasing adjustment to avoid collisions causes a shift at a transition module resulting in a longer exchange time for that module. The data in the master move table can also be used to calculate the bottle neck resources. If the robots are free to operate at a lower speed because of some other bottleneck, the bottleneck condition is defined.

In step 1640, TACT time is distributed and bottleneck resources are defined. If fortunate enough to have extra resources (i.e. chamber or robots not in the bottleneck), then the extra time (spare utilization) may be distributed as TACT time. Various rules for optimization of extra time will apply based on processing requirements and specific customer preferences.

TACT time is directly related to the wafer capacity. For example, if the cluster tool 10 is running at 180 WPH or 20 second cycle time, the process time plus the exchange time plus TACT time will add up to some multiple of 20 seconds. The exchange time is determined by how the flow (wafer in to wafer out) is run. The distribution of TACT time depends on the processing requirements and specific customer preferences. For example, referring to the master move table of FIG. 9, if the BARC process time is 45 seconds and the exchange time is 4.2 seconds, then TACT time is 13.2 seconds (e.g. 20.8*3=62.4; 62.4−45−4.2=13.2 seconds).

Cascading

As noted above one of the key elements to a desirable process sequence performed on a substrate in a cluster tool system is the need to assure that each wafer processed has a similar wafer history while also maintaining a high wafer throughput. This key element is also applicable to the processing of wafer lots. On most track lithography systems, several substrate processing constraints must be satisfied to assure that a constant wafer history is achieved. These constraints are usually satisfied by creating large gaps between the lots of wafers. Unfortunately, these large gaps lead to an increase in lot processing time and a corresponding decrease in the efficiency of the track system. While it can be argued that changes in wafer history at certain points in the process flow will have little or no impact on the process flow, whether these changes impact the process flow is influenced by several factors including: the type of resist, the device, and the process window for each specific process. However, it is still preferable to maintain a constant wafer history.

Another process for increasing the system throughput while maintaining constant "wafer history" and reducing the system cost and complexity is called "cascading." Cascading is defined as running two or more lots in a track system at the same time, for example, lot A and lot B. The goal of cascading is to provide the user with the capability to minimize the gaps between lot A and lot B and thus increase substrate throughput, while maintaining a constant wafer history for the wafers in each lot. Minimizing the gaps between lot A and lot B increases the utilization of the scanner and thus the productivity of the cluster tool.

In certain embodiments, in order to maintain the same wafer history, several criteria must be met. First, the cycle time from the pass through input (PTi) to the scanner interface 5 must be the same for all wafers within a lot, except for wafers that have completed PAB and are waiting for the scanner 5. Due to scanner 5 processing variability, it is sometimes necessary and acceptable to buffer wafers in front of the scanner 5. Second, cycle time from exposure completion to the beginning of post exposure bake (PEB) start—Post exposure delay (PED)—is set as a track recipe parameter. Third, the cycle time from PED chill to pass through output is repeatable within 3 seconds. Wafers exit the scanner at regular intervals and as a result, these wafers will enter the PEB at regular intervals. However, the wafers must leave the PEB module at regular intervals consistent with the Process Transfer Robot Schedule. The only way to match the irregular flow with the regular flow is to allow variable time (buffer time) at the PEB chill step.

Wafer history must be maintained in order to achieve repeatable process results. This means that the average throughput, robot timing, and schedule rules, must be applied in the same manner. For example, if lot A is running on the tool with one recipe and lot B is scheduled next, but has a shorter recipe time for most steps, adding additional slack time to the lot B process time is not permitted as a means to improve cascading.

There are several possible scheduling modes or embodiments for cascading. The first scheduling mode is a more conventional schedule in which the robots and slack time are matched as much as possible with the scanner throughput and/or chamber bottleneck(s). In the case of the first scheduling mode, slack time for the chambers and robots is evenly distributed so the system runs at a slower rate. The second mode is a constant robot throughput schedule that maximizes the opportunity for cascading. In the case of the second scheduling mode, the system runs at a faster rate and the slack time is lumped as a wafer send skip or "phantom wafer."

The first scheduling mode creates an enhanced schedule for a given product based on the scanner throughput and process recipe independent of other lots. The robots and other system resources are balanced with the scanner throughput. The robot synchronization timing is set to match the scanner 5. In most cases, the process robots will have slack time. Thus the robots will be scheduled to have increased translation or move times from module to module. In one embodiment robot move time is increased by forcing the robot to wait before doing a drop. In another embodiment, robot move time is increased by reducing the speed of the robot.

In the first scheduling mode, the scheduled throughput of the track is slightly faster than the scanner 5. If the track gets ahead of the scanner 5, wafers will begin to fill the scanner interface buffer. Only then will the track skip a wafer send or several wafer sends, to force reduction in the buffer.

With the first scheduling mode, in certain embodiments, the same schedule may be run each time the same recipe sequence and product is run on the tool. If a first scheduling mode schedule is run on the tool for lot A, then lot B will have to wait until all wafers from lot A have reached the PEB before the first wafer from lot B is picked from the input pass through. This creates a gap in the tool sequence pipeline that ensures that no resources are serving both lot A and lot B simultaneously. In some embodiments, lots are cascaded with a small gap in the pipeline.

The second scheduling mode creates an enhanced schedule for a given product based on process recipe and scanner throughput in much the same manner as the first scheduling mode, however, in the case of the second scheduling mode, the schedule is defined to maximize cascading flexibility. This is done by running all process robots at the same maximum robot limited throughput for all process flows. In the first scheduling mode, slack time for the robots and the process modules is distributed throughout the schedule to closely match the running rate of the track with the scanner. The track will skip a wafer send only when the buffer begins to fill at the scanner interface. In the second scheduling mode, the track speed is not matched with the scanner speed but rather is higher than the scanner speed, possibly much higher. As a result, the scheduler proactively implements skips in sending wafers so the average track throughput is equal to or slightly higher than the scanner throughput. Additional wafer send skips are implemented if the buffer begins to fill beyond the send limit.

In the second scheduling mode, all wafers will see the same schedule with minimal slack time. Slack time is eliminated or minimized because each wafer is sent through the tool at maximum speed (minimum cycle time). Average throughput to the scanner is controlled by skipping a wafer send. For example, if the maximum speed of the track is 10% higher than the stepper, then after every 10 wafers, a wafer send will be skipped. This skipped wafer is scheduled through the system as a "phantom wafer." As a result, the robots continue to move as if they were physically moving the phantom wafer. In some embodiments, it is necessary to randomize or shift the skip point to rotate through the process modules. For example, if three bowls are active and the track needs to skip every third wafer send to match the scanner speed, then the same bowl will always be skipped. In this case a decision must be made to use only two of the bowls for the process or to shift the wafer send skip so the idle time is rotated to each bowl.

Figure 10A:
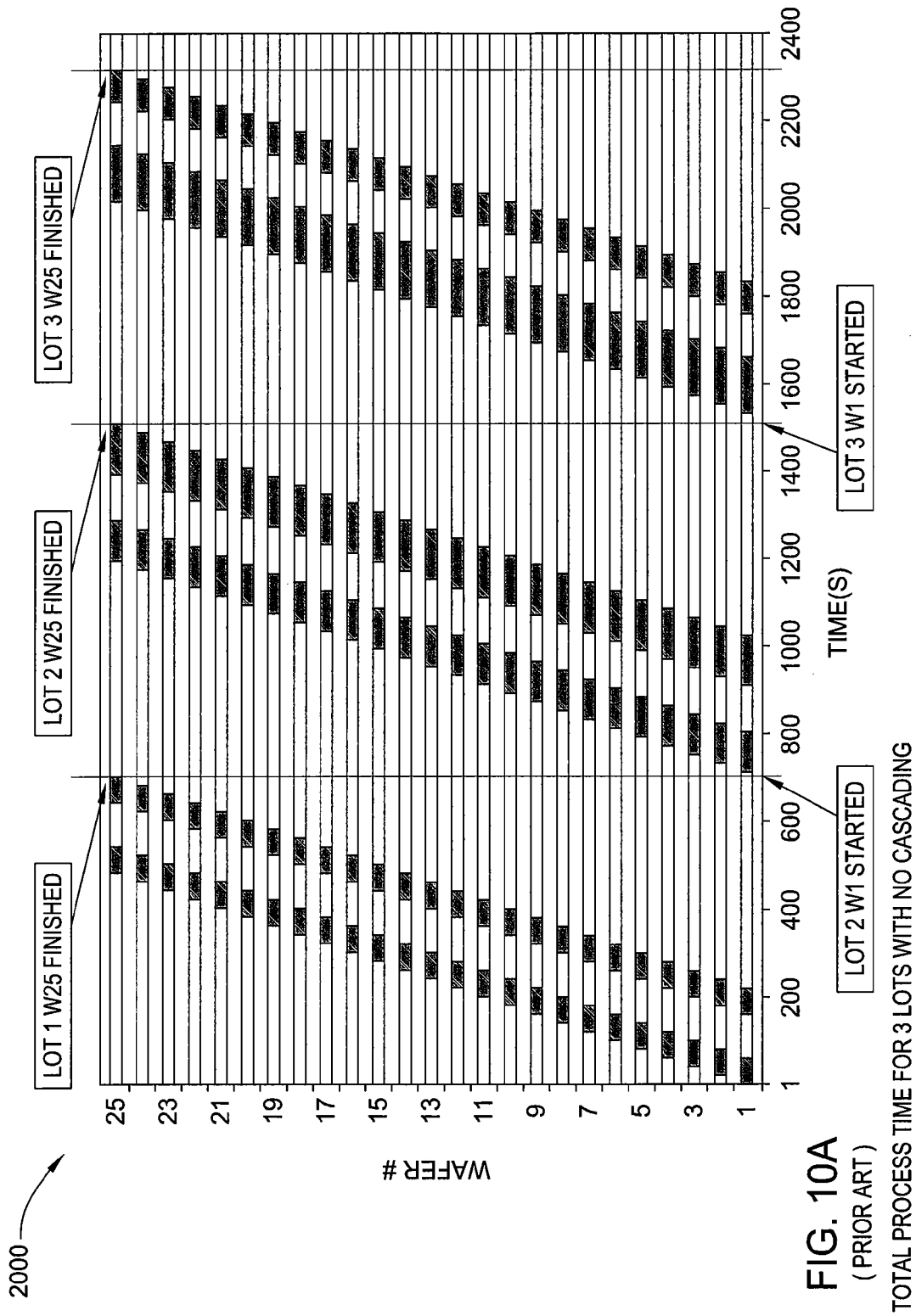
FIG. 10A is a chart illustrating the processing time for three lots of 25 wafers each using techniques known in the prior art.

FIG. 10A is a time chart 2000 representing the time it takes to process three lots of 25 wafers each using techniques known in the prior art. The x-axis represent the processing time in seconds. The y-axis represents the wafer number in each of the three lots, for example, wafers 1-25 for each of a first, second, and third lot respectively. This example was performed by running three different lots of 25 wafers each. The goal is to complete all three lots within the fastest time while maintaining a constant wafer history. In this prior art example, three lots are run without cascading. The flows of the wafers for each lot are mapped out showing no resource conflict and thus a steady-state wafer flow. The processing of the last wafer, wafer #25 of lot 1, is completed before wafer #1 of lot 2 begins processing. The processing of the last wafer, wafer #25 of lot 2, is completed before the processing of wafer #1 of lot 3 begins. The total amount of time to run all three lots is the sum of each of the lots running separately. The total time for completion is 2310 seconds.

Figure 10B:
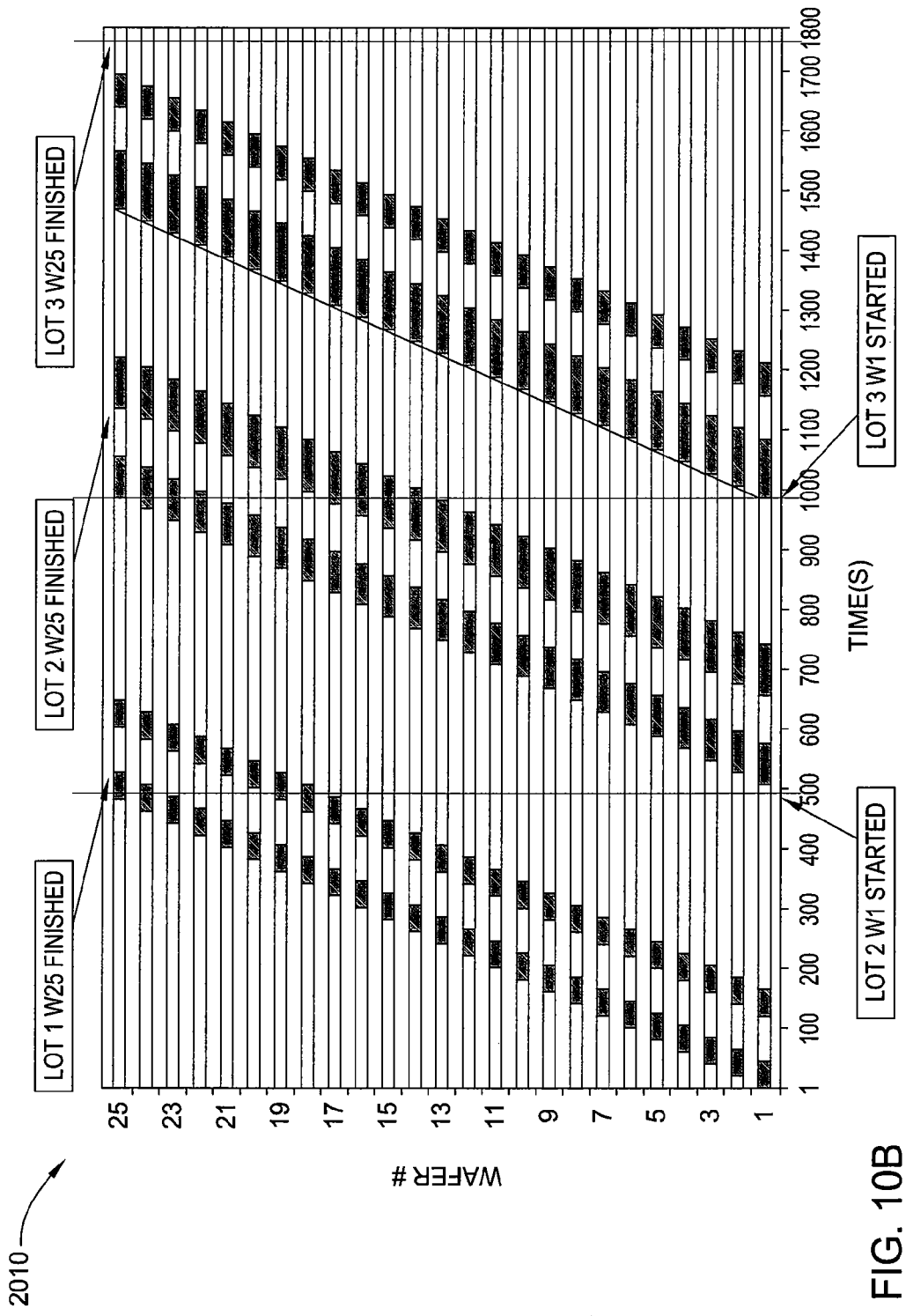
FIG. 10B is a chart illustrating the processing time for three lots of 25 wafers each in accordance with one embodiment of the present invention.

FIG. 10B is a time chart 2010 representing the time it takes to process three lots of 25 wafers each using one embodiment of the present invention. The x-axis represents the processing time in seconds. The y-axis represents the wafer number in each of the three lots, for example, wafers 1-25 for a first, second, and third lot respectively. Using the cascading method, wafer #1 of lot 2 begins processing while some wafers from lot #1 are still in the tool. Wafer #1 of lot 2 begins processing approximately 18 seconds after wafer #25 of lot 1 begins processing. Wafer #1 of lot 3 begins processing while some wafers from lot 2 are still in the tool. Wafer #1 of lot 3 begins processing approximately 16 seconds after wafer #25 of lot 2 begins processing. The graph shows no resource conflict during the transition between each flow. The use of the current method allows for the completion of 3 lots of wafers in about 1790 seconds. That is a savings of 520 seconds while maintaining a constant wafer history for each lot.

While the foregoing is directed to embodiments of the present invention, other and further embodiments of the invention may be devised without departing from the basic scope thereof, and the scope thereof is determined by the claims that follow.

The invention claimed is:

1. A method of transferring a substrate one or more substrates in a cluster tool, comprising:
  providing a cluster tool comprising:
    a first processing rack containing vertical stacks of substrate processing chambers;
    a second processing rack containing vertical stacks of substrate processing chambers;
    a first robot assembly disposed adjacent to the first processing rack, comprising:
      at least one horizontal motion assembly;
      a vertical motion assembly;
      a robot hardware assembly; and
      a robot blade coupled with the robot hardware assembly, wherein the first robot assembly is adapted to transfer a substrate between the substrate processing chambers in the first processing rack;
    a second robot assembly disposed adjacent to the first robot assembly between the first processing rack and the second processing rack, comprising:
      at least one horizontal motion assembly;
      a vertical motion assembly;
      a robot hardware assembly; and
      a robot blade coupled with the robot hardware assembly, wherein the second robot assembly is adapted to transfer a substrate between the substrate processing chambers in the first processing rack and/or the second processing rack; and
    wherein a side of the first processing rack and a side of the second processing rack are both aligned along a direction parallel to the horizontal motion assemblies of the first and second robot assemblies; and
  transferring a first substrate using the first robot assembly, wherein transferring the first substrate comprises:
    removing the first substrate from a first processing chamber positioned in the side of the first processing rack;

moving the first robot assembly from a position adjacent to the first processing chamber to a position adjacent to a second processing chamber positioned in the side of the first processing rack; and placing the first substrate in the second processing chamber;

transferring a second substrate using a second robot assembly, wherein transferring the second substrate comprises:

removing the second substrate from a third processing chamber positioned in either the side of the first processing rack or the side of the second processing rack:

moving the second robot assembly from a position adjacent to the third processing chamber to a position adjacent to a fourth processing chamber positioned in either the side of the first processing rack or the side of the second processing rack; and placing the second substrate in the fourth processing chamber; and synchronizing the removing the first substrate with the removing the second substrate, the moving the second robot assembly, or the placing the second substrate; and synchronizing the placing the first substrate with the removing the second substrate, the moving the second substrate, or the placing the second substrate, wherein the transferring the first substrate and transferring the second substrate are completed within a first period of time.

2. The method of claim 1, wherein the length of the first period of time is defined by the slower of the transferring the first substrate and the transferring the second substrate.

3. The method of claim 1, wherein the each of the first, the second, the third, and the fourth processing chambers are selected from a group consisting of a coater chamber, a developer chamber, a HMDS process chamber, a chill chamber, and a bake chamber.

4. The method of claim 1, wherein the cluster tool further comprises:

a third robot assembly disposed adjacent to the second processing rack, comprising:
 at least one horizontal motion assembly;
 a vertical motion assembly;
 a robot hardware assembly; and
 a robot blade coupled with the robot hardware assembly, wherein the third robot assembly is adapted to transfer a substrate among the substrate processing chambers in the second processing rack within the first period of time.

5. The method of claim 4, further comprising:
transferring a third substrate using the third robot assembly, wherein transferring the third substrate comprises:
 removing the third substrate from a fifth processing chamber positioned in the second processing rack;
 moving the third robot assembly from a position adjacent to the fifth processing chamber to a position adjacent to a sixth processing chamber positioned in either the second processing rack; and
 placing the third substrate in a sixth processing chamber, wherein transferring the third substrate is completed during the first period of time.

6. The method of claim 5, further comprising:
synchronizing the removing the first substrate with the removing the third substrate, the moving the third robot assembly, or the placing the third substrate.

7. The method of claim 5, wherein the substrate processing chambers are each individually selected from one of the following: a coater chamber, a developer chamber, a HMDS chamber, a chill chamber, or a bake chamber.

8. The method of claim 4, wherein the first robot assembly and the second robot assembly overlap with one another and the second robot assembly and the third robot assembly overlap with one another.

9. The method of claim 8, wherein the overlap is the ability of two or more robots to access and/or independently transfer substrates between the same processing chambers in the same processing rack.

10. The method of claim 9, wherein the overlapping robot assemblies are able to simultaneously access processing chambers that are horizontally adjacent (x-direction) or vertically adjacent (y-direction) to each other in the same processing rack.

11. The method of claim 1, further comprising depositing one or more uniform resist layers on the surface of the first substrate.

12. The method of claim 11, further comprising:
transferring the first substrate out of the cluster tool to a separate stepper or scanner tool;
patterning the substrate surface by exposing the resist layer to a resist modifying electromagnetic radiation; and
developing the patterned resist layer.

13. A cluster tool for processing one or more substrates, comprising:
a first processing rack containing vertical stacks of substrate processing chambers;
a second processing rack containing vertical stacks of substrate processing chambers;
a first robot assembly disposed adjacent to the first processing rack, comprising:
 at least one horizontal motion assembly;
 a vertical motion assembly;
 a robot hardware assembly; and
 a robot blade coupled with the robot hardware assembly, wherein the first robot assembly is adapted to transfer a substrate between the substrate processing chambers in the first processing rack;
a second robot assembly disposed adjacent to the first robot assembly between the first processing rack and the second processing rack, comprising:
 at least one horizontal motion assembly;
 a vertical motion assembly;
 a robot hardware assembly; and
 a robot blade coupled with the robot hardware assembly, wherein the second robot assembly is adapted to transfer a substrate between the substrate processing chambers in the first processing rack and/or the second processing rack; and
wherein a side of the first processing rack and a side of the second processing rack are both aligned along a direction parallel to the horizontal motion assemblies of the first and second robot assemblies; and
a controller configured for:
defining a process sequence containing a plurality of substrate transfer steps, wherein the plurality of substrate transfer steps are adapted to aid in the movement of one or more substrates through the substrate processing chambers contained in the cluster tool;
distributing at least one of the substrate transfer steps contained in the process sequence to the first robot assembly and at least one of the substrate transfer steps contained in the process sequence to the second robot assembly;
synchronizing the movement of the first robot assembly and the second robot assembly so that each substrate transfer step performed by the first robot assembly and each of the substrate transfer steps performed by the second robot assembly that overlap in time both are performed within a first time interval, wherein the next substrate transfer step performed by the first robot assembly and the second robot assembly will not start until the after the first time interval is completed and the next substrate transfer step is performed within a second time interval; and executing the transfer steps.

14. The cluster tool of claim 13, wherein the substrate processing chambers are each selected from one of the following: a coater chamber, a developer chamber, a HMDS chamber, a chill chamber, or a bake chamber.

15. The cluster tool of claim 13, further comprising:
a third robot assembly disposed adjacent to the second processing rack, comprising:
at least one horizontal motion assembly;
a vertical motion assembly;
a robot hardware assembly, and
a robot blade coupled with the robot hardware assembly, wherein the third robot assembly is adapted to transfer a substrate among the substrate processing chambers in the second processing rack within the first time interval.

16. The cluster tool of claim 15, wherein the first robot assembly and the second robot assembly overlap with one another and the second robot assembly and the third robot assembly overlap with one another.

17. The cluster tool of claim 16, wherein the overlap is the ability of two or more robots to access and/or independently transfer substrates between the same processing chambers in the same processing rack.

18. The cluster tool of claim 16, wherein the overlapping robot assemblies are able to simultaneously access processing chambers that are horizontally adjacent (x-direction) or vertically adjacent (y-direction) to each other in the same processing rack.

* * * * *

UNITED STATES PATENT AND TRADEMARK OFFICE
CERTIFICATE OF CORRECTION

PATENT NO. : 8,019,467 B2  
APPLICATION NO. : 11/775355  
DATED : September 13, 2011  
INVENTOR(S) : Hongkham et al.

Page 1 of 1

It is certified that error appears in the above-identified patent and that said Letters Patent is hereby corrected as shown below:

In the Claims:

Column 30, Claim 1, Line 31, please delete "a substrate".

Signed and Sealed this
Twentieth Day of December, 2011

David J. Kappos
*Director of the United States Patent and Trademark Office*